United States Patent
Sugiyama et al.

(10) Patent No.: US 7,109,128 B2
(45) Date of Patent: Sep. 19, 2006

(54) SEMICONDUCTOR DEVICE AND METHOD OF MANUFACTURING THE SAME

(75) Inventors: Koichi Sugiyama, Kawasaki (JP); Yoshihiro Takao, Kawasaki (JP); Shinji Sugatani, Kawasaki (JP); Daisuke Matsunaga, Kawasaki (JP); Takayuki Wada, Kawasaki (JP); Tohru Fujita, Kawasaki (JP); Hikaru Kokura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 157 days.

(21) Appl. No.: 10/866,763

(22) Filed: Jun. 15, 2004

(65) Prior Publication Data

US 2004/0224517 A1  Nov. 11, 2004

Related U.S. Application Data

(62) Division of application No. 10/261,695, filed on Oct. 2, 2002, now Pat. No. 6,800,909.

(30) Foreign Application Priority Data

Oct. 4, 2001 (JP) ............................. 2001-308429
Aug. 30, 2002 (JP) ............................. 2002-256229

(51) Int. Cl.
  *H01L 21/302* (2006.01)
(52) U.S. Cl. .................. 438/745; 438/302; 438/303; 438/706
(58) Field of Classification Search ................ 438/303, 438/305, 306, 302, 706, 710, 717, 745
See application file for complete search history.

(56) References Cited

U.S. PATENT DOCUMENTS 5,583,067 A * 12/1996 Sanchez .................. 438/289
6,190,981 B1 * 2/2001 Lin et al. .................. 438/305
6,306,712 B1  10/2001 Rodder et al. ............. 438/289
6,335,554 B1 * 1/2002 Yoshikawa ................ 257/316
2003/0013242 A1 * 1/2003 Lai et al. ................... 438/197

FOREIGN PATENT DOCUMENTS

| JP | 5-183155 | 7/1993 |
| JP | 6-326123 | 11/1994 |
| JP | 8-162541 | 6/1996 |

(Continued)

OTHER PUBLICATIONS

Pidin et al.; "Experimental and Simulation Study on Sub-50 nm CMOS Design", 2001 Symposium on VLSI Technology Digest of Technical Paper (2 pages)/Discussed in specification.

(Continued)

*Primary Examiner*—Lan Vinh
(74) *Attorney, Agent, or Firm*—Westernman, Hattori, Daniels & Adrian, LLP.

(57) ABSTRACT

There are provided a gate electrode formed on a semiconductor substrate of one conductivity type via a gate insulating film, ion-implantation controlling films formed on both side surfaces of the gate electrode and having a space between the gate electrode and an upper surface of the semiconductor substrate, first and second impurity diffusion regions of opposite conductivity type formed in the semiconductor substrate on both sides of the gate electrode and serving as source/drain, a channel region of one conductivity type formed below the gate electrode between the first and second impurity diffusion regions of opposite conductivity type, and pocket regions of one conductivity type connected to end portions of the impurity diffusion regions of opposite conductivity type in the semiconductor substrate below the gate electrode and having an impurity concentration of one conductivity type higher than the channel region.

14 Claims, 25 Drawing Sheets

FOREIGN PATENT DOCUMENTS

| | | |
|---|---|---|
| JP | 9-213941 | 8/1997 |
| JP | 10-294453 | 11/1998 |
| JP | 2000-269500 | 9/2000 |
| JP | 2001-267562 | 9/2001 |

OTHER PUBLICATIONS

Ghani et al.; "100 nm Gate Length High Performance/Low Power CMOS Transistor Structure", 1999 IEEE, (4 pages)/Discussed in specification.

* cited by examiner

SEMICONDUCTOR DEVICE AND METHOD OF MANUFACTURING THE SAME

CROSS-REFERENCE TO RELATED APPLICATIONS

This application is a DIV of Ser. No. 10/261,695 Oct. 2, 2002 now U.S. Pat. No. 6,800,909

This application is based upon and claims priority of Japanese Patent Applications No. 2001-308429 filed in Oct. 4, 2001, and No. 2002-256229, filed in Aug. 30, 2002, the contents being incorporated herein by reference.

BACKGROUND OF THE INVENTION

1. Field of the Invention

The present invention relates to a semiconductor device and a method of manufacturing the same and, more particularly, a semiconductor device having one conductivity type impurity regions, that are formed in vicinity of two opposite conductivity type impurity diffusion regions constituting the source/drain in one conductivity type substrate respectively by the pocket injection technology, and a method of manufacturing the same.

2. Description of the Prior Art

The MOS transistor is designed based on the scaling theory. If the MOS transistor whose gate length is less than 50 nm is fabricated based on this theory, the short channel effect is generated. In order to suppress such short channel effect, for instance, the technology of increasing the n-type impurity concentration in vicinity of top ends of the n-type impurity diffusion regions serving as the source/drain in the p-type silicon substrate rather than the p-type impurity concentration of the channel region, i.e., the pocket injection technology, is being watched with interest.

Then, the application of the pocket injection technology to the steps of forming the MOS transistor will be explained hereunder.

First, as shown in FIG. 1A, the gate electrode 103 is formed on the p-type silicon substrate 101 via the gate insulating film 102. This gate electrode 103 has such a structure that the notch (pitch) 103a is formed at its lower portion, and is called the notch-type gate electrode. In FIG. 1A, a reference 106 denotes the device isolation STI (shallow trench isolation) formed in the silicon substrate 101.

Then, as shown in FIG. 1B, the p-type impurity is ion-implanted into the silicon substrate 101 in the oblique direction to the substrate surface. Thus, the p-type pocket regions 101a whose p-type impurity concentration is higher than the channel region are formed on both sides of the gate electrode 103 in the p-type silicon substrate 101. A distance between end portions of two p-type pocket regions 101a is shorter than a width (gate length) of the gate electrode 103 at the lower portion of the gate electrode 103, and also the p-type pocket regions 101a are formed away from the surface of the silicon substrate 101.

Then, as shown in FIG. 1C, the n-type impurity regions (extension regions) 104a are formed on both sides of the gate electrode 103 by ion-implanting the n-type impurity in the direction substantially perpendicular to the p-type silicon substrate 101 while using the gate electrode 103 as a mask.

Then, as shown in FIG. 1D, the insulating film is formed on the silicon substrate 101 and the gate electrode 103 by the CVD method. Then, the sidewall spacers 105 are left on the side surfaces of the gate electrode 103 by isotropic-etching the insulating film in the vertical direction. Then, the n-type impurity regions 104b of high concentration are formed on both sides of the gate electrode 103 by ion-implanting the n-type impurity into the silicon substrate 101 while using the gate electrode 103 and the sidewall spacers 105 as a mask.

The n-type impurity diffusion regions 104 serving as the source/drain and having the LDD structure are constructed by the n-type impurity diffusion regions 104a, 104b, that are formed by executing twice the ion implantation as described above, respectively. The p-type pocket regions 101a are jointed to lower portions of the end portions of the n-type impurity diffusion regions 104.

Accordingly, the channel region that is formed in vicinity of the gate electrode 103 and the p-type pocket regions 111a whose p-type impurity concentration is higher than the channel region are present between two n-type impurity diffusion regions 104.

With the above, the n-type MOS transistor is formed on the silicon layer 101. In this case, if the p-type MOS transistor is to be formed, the silicon substrate is set to the n-type, and the impurity that is ion-implanted to form the pocket regions is set to the n-type, and the impurity that is ion-implanted to form the source/drain is set to the p-type.

After such MOS transistor is formed, although not shown, the silicide layer is formed on the silicon substrate 101 and the gate electrode 103, then the interlayer insulating film for covering the MOS transistor is formed on the silicon substrate 101, and then the multi-layered wiring structure, etc. are formed on the interlayer insulating film. But their details are omitted.

The pocket injection technology that employs the notch-type gate electrode as described above is set forth in S. Piddin et.al, Symp. VLSI tec. 2001 p. 35, for example.

Meanwhile, it will be explained hereunder which pocket is formed if the pocket is formed by using the normal gate electrode having no notch portion 103a.

First, as shown in FIG. 2A, in the situation that the gate electrode 111 whose cross section is formed as a rectangle is formed on the silicon substrate 101 via the gate insulating film 102, the p-type impurity having the same conductivity type as the silicon substrate 101 is ion-implanted (I.I) in the oblique direction to the substrate surface. In this case, since the distribution of the thickness of the gate electrode 111 is generated along the ion implantation direction of the p-type impurity, the corners of the lower portions of the gate electrode 111 are mostly reduced in thickness.

Therefore, as shown in FIG. 2B, the p-type impurity that is obliquely ion-implanted into the surface of the silicon substrate 101 exists at an almost uniform depth in the portion, in which the gate electrode 111 is not formed, out of the silicon substrate 101. However, the energy of the p-type impurity that has passed through the corners of the lower portions of the gate electrode 111 is attenuated, and thus shallow peaks are present in the silicon substrate 101. Also, the impurity that is ion-implanted via the thick portions of the gate electrode 111 is absorbed in the gate electrode 111 and does not come up to the inside of the silicon substrate 101. Accordingly, the p-type impurity high concentration region 101a has the distribution of the concentration peak such that, as shown in FIG. 2B, the concentration peak is shallow under the gate electrode 111 but is deep on both sides of the gate electrode 111.

The high concentration profile of the p-type impurity when the p-type impurity is ion-implanted into the n-type substrate 101, on which the gate electrode 111 without the notch is formed, in the oblique direction from the normal is shown in FIG. 3. In FIG. 3, as illustrated in the area encircled by a broken line, the regions in which the p-type impurity concentration is higher than the original concentration are present in the channel region in vicinity of the surface of the silicon substrate 101. In this case, the black portions in FIG. 3 denote the portion whose p-type impurity concentration is higher than the channel region.

In this manner, if the pocket portions 101a have the concentration distribution close to the channel region under the gate electrode 111, such distribution interferes with the increase of the ON-current and thus the increase in the circuit speed becomes difficult.

In contrast, if the notch-type gate electrode 103 shown in FIG. 1A is employed, the impurity that is obliquely ion-implanted (I.I) through the notch portion 103a of the gate electrode 103 can be injected deeply, as shown in FIG. 4A, like the region in which the gate electrode 103 is not present. Also, when the ions that are obliquely implanted into the gate electrode 103 serving as the visor on the notch portion 103a are passed through the gate electrode 103, a part of such ions loses the energy and reaches the notch portion 103a, so that the ions does not come up to the silicon substrate 101. As a result, as shown in FIG. 4B, the p-type pocket regions 101a do not appear at the shallow portion in the silicon substrate 101 under the notch-type gate electrode 103.

The profile of the pocket regions when the p-type impurity is ion-implanted into the silicon substrate 101, on which the notch-type gate electrode 103 is formed, in the oblique direction from the normal is shown in FIG. 5. In FIG. 5, as illustrated in the area encircled by a broken line, the regions which have the relatively high concentration of the p-type impurity are not present in the channel region of the silicon substrate 101. In this case, the black portions in FIG. 5 denote the portion whose p-type impurity concentration is higher than the channel region.

As a result, if the pocket regions are formed with using the notch-type gate electrode, the ON-current of the transistor can be increased and also the enhancement of the circuit speed can be facilitated, in contrast to the case where the pocket regions are formed by using the gate electrode without the notch. In other words, the desired transistor characteristics cannot be obtained by using the normal gate structure having no notch.

In the prior art, the notch-type gate electrode is formed via following steps by using the method of switching the etching conditions.

First, as shown in FIG. 6A, the polysilicon film 103p is formed on the silicon substrate 101, and then the photoresist 112 having the gate shape is formed thereon.

Then, as shown in FIG. 6B, as the first etching step, the upper portion of the polysilicon film 103p is etched by using the HBr/O$_2$-containing gas while using the photoresist 112 as a mask, so that the upper portion of the polysilicon film 103p left under the photoresist 112 is used as the upper portion of the gate electrode 113. In the first etching step, the etching conditions that make it possible to adhere a plenty of deposition 113a onto the side surfaces of the upper portions of the gate electrode 113 should be set.

Then, as shown in FIG. 6C, as the second etching step, the residual of the polysilicon film 103p is etched by using the photoresist 112 as a mask to form the lower portion of the gate electrode 113. In the second etching step, the etching conditions that make it possible to reduce an amount of the deposition 113b, which is adhere onto the side surfaces of the lower portions of the gate electrode 113, should be set.

Then, as shown in FIG. 6D, as the third etching step, the gate electrode 103 under the photoresist 112 is isotropically etched. In this third etching step, the upper portions of the gate electrode 103 are not narrowed since the side surfaces are protected by the thick deposition 113a, but the lower portions of the gate electrode 103 are narrowed by the isotropic etching since the desposition 113b on the lower portions is thin. As a result, the notches are formed on the side surfaces of the lower portions of the gate electrode 103.

In this case, the notch-type gate electrode 103 is set forth in S. Piddin et al., Symp. VLSI Tec. 2001 p. 35–p. 36, T. Ghani et al., IEDM1999 S17-1, etc.

In addition, the method of forming the pockets at end portions of the source/drain impurity diffusion regions without the above notch-type gate electrode is set forth in Patent Application Publication (KOKAI) Hei 10-294453, for example.

In the pocket forming method in Patent Application Publication (KOKAI) Hei 10-294453, as shown in FIG. 7A, the polysilicon film 115 is formed on the silicon substrate 101 via the gate insulating film 102, then the polysilicon film 115 is unisotropically etched by using the photoresist 112 having the gate shape as a mask, and then the remaining polysilicon film 115 is employed as the gate electrode 115g. Then, as shown in FIG. 7B, the gate electrode 115g on which the photoresist 112 is formed is etched by the wet process in the lateral direction, and thus the gate electrode 115g is narrowed rather than the pattern width of the photoresist 112. Then, as shown in FIG. 7C, the titanium film 116 is formed on the photoresist 112, and thus the visor of the gate electrode 115g is formed by the photoresist 112 and the titanium film 116. Then, in order to form the pocket portions, the p-type impurity is ion-implanted (I.I) in the oblique direction to the substrate surface.

In Patent Application Publication (KOKAI) Hei 10-294453, the steps of forming the silicon nitride film on the silicon substrate, forming the holes each having the inverse trapezoid shape in the silicon nitride film, and filling the gate electrodes made of polysilicon into the holes, whereby the gate electrodes each having the inverse trapezoid sectional shape are formed are set forth. The gate electrodes each having the inverse trapezoid sectional shape are employed as a mask for the pocket formation.

Also, in Patent Application Publication (KOKAI) 2001-267562, it is set forth that a surface of the gate electrode is covered with the contamination-preventing insulating film, then the amorphous silicon film is formed on the contamination-preventing insulating film and the silicon substrate, then the silicon nitride film is formed on the amorphous silicon film, then the silicon nitride film is left on the sides of the gate electrode by applying the unisotropic etching, and then the amorphous silicon film is etched by using the silicon nitride film as a mask.

By the way, as shown in FIGS. 6A to 6D, the notch portions 103a of the gate electrode 103 are formed by selectively isotropically etching the lower portion of the gate electrode 103. However, the state density of the plasma, etc. in the etching chamber is not uniform in etching, and also the etching state becomes uneven on the silicon substrate 101 because of the presence of the density difference of the patterns. Therefore, there is caused the problem that variations in depth and height of the notch portions 103a caused on the substrate surface are increased.

In addition, as shown in FIGS. 7A to 7C, the width of the gate electrode 115g is narrowed rather than the width of the resist mask 112 formed thereon by the isotropic-etching in the wet process. However, if the width of the gate electrode 115g is reduced smaller than 50 nm, for example, it becomes difficult to control the width of the gate electrode 115g by the wet process, so that the variation in the width of plural gate electrodes 115g on the substrate is caused.

Besides, as set forth in Patent Application Publication (KOKAI) Hei 10-294453, it is difficult to form the gate electrodes each having the inverse trapezoid sectional shape in plural in the holes, that are formed in the silicon nitride film to have the inverse trapezoid shape, to have a uniform width. Thus, this is also ready to cause the variation in the width of the gate electrodes.

Moreover, in Patent Application Publication (KOKAI) 2001-267562, since the gate electrode is covered with the contamination-preventing insulating film, a variation in the width of the gate electrode is seldom caused when the amorphous silicon film formed on the gate electrode and the silicon substrate is etched. However, since three types of films having different film quality are formed around the gate electrode and also three types of films must be etched separately, the number of steps is increased. In addition, since the width of the gate electrode is widened substantially by adding the amorphous silicon film, a distance between the gate electrodes cannot be reduced.

As described above, it turns out that it is difficult to control by the conventional structure the width of gate electrode used as a mask of the ion-implantation at the time of forming a pocket part.

SUMMARY OF THE INVENTION

It is an object of the present invention to provide a semiconductor device having a structure, in which the gate electrode employed when the pocket regions connected to the source/drain of the MOS transistor are formed can keep a stable shape, and a method of manufacturing the same.

The above subject is solved by providing a semiconductor device which comprises a gate electrode formed on a semiconductor substrate of one conductivity type via a gate insulating film; an insulating ion-implantation controlling film formed of a first insulating film and a second insulating film which are made of a different material and formed on each of both side surfaces of the gate electrode in order, and the first insulating film and the second insulating film having spaces, higher than the gate insulating film, between the semiconductor substrate both sides of the gate electrode; first and second impurity diffusion layers of an opposite conductivity type formed on both sides of the gate electrode in the semiconductor substrate as source/drain; a channel region of one conductivity type formed between the first and second impurity diffusion layers of the opposite conductivity type in the semiconductor substrate and below the gate electrode; and first and second pocket regions of one conductivity type, having a concentration of one conductivity type impurity higher than the channel region, connected to respective end portions of the first and second impurity diffusion layers of the opposite conductivity type, in the semiconductor substrate below the channel region.

Also, the above subject is solved by providing a manufacturing method of a semiconductor device which comprises the steps of forming a gate electrode on a semiconductor substrate of one conductivity type via a gate insulating film; forming a first insulating film over an upper surface of the semiconductor substrate and an upper surface and side surfaces of the gate electrode; forming a second insulating film, which is made of different material from the first insulating film, on the first insulating film; etching the second insulating film to leave over sides of the gate electrode; etching selectively the first insulating film by using the second insulating film as a mask to leave in a region between the gate electrode and the second insulating film and to form spaces between the semiconductor substrate and the first insulating film and between the semiconductor substrate and the second insulating film; forming first and second pocket regions of one conductivity type on both sides under the gate electrode by implanting one conductivity type impurity ion into an upper surface of the semiconductor substrate in an oblique direction while using the first insulating film and the second insulating film, being left on the sides of the gate electrode, and the gate electrode as a first mask; and forming first and second impurity diffusion regions of opposite conductivity type, which are connected to the first and second pocket regions in the semiconductor substrate separately and serve as source/drain, by introducing an opposite conductivity type impurity into the semiconductor substrate while using the first insulating film and the second insulating film, being left on the sides of the gate electrode, and the gate electrode as a second mask.

According to the present invention, the notch-containing structure in which the first and second insulating films, with which the spaces (notches) are formed between the semiconductor substrate, are formed on the side surfaces of the gate electrode is employed.

The combinational shape of the gate electrode and the first and second insulating films on both sides of the gate electrode resembles the notch-type gate electrode. In structure, if the height of the notch is set larger than the thickness of the gate insulating film under the gate electrode, lower portions of the side surfaces of the gate electrode are exposed. Then, in order to form the pocket regions, the impurity ion is implanted into the semiconductor substrate via the notches.

Therefore, if the impurity is ion-implanted into the semiconductor substrate in the oblique direction by using the notch structure as a mask, the pocket regions formed by the ion implantation can be formed under the channel region and at predetermined depth positions. The impurity in the pocket regions has the same conductivity as the channel region. In addition, the pocket regions are connected to end portions of the opposite conductivity type impurity diffusion regions serving as the source/drain.

Also, since the shape of the gate electrode can be decided by etching the conductive film (e.g., impurity-containing silicon film) only once using a mask, the gate electrode can have a stable shape. Thus, variation in the gate length caused by applying the isotropic etching to the lower portions of the gate electrode after the gate electrode is formed can be prevented, and thus the stable transistor characteristics can be obtained. In addition, since the bottom surface and the top surface of the gate electrode can be formed to have the substantially same width, the distance between the gate electrodes can be reduced rather than the notch-type gate electrode in the prior art.

Further, since the depth of the notch portion under the first and second insulating films in the lateral direction can be controlled easily by adjusting the thicknesses of the first and second insulating films, variation in the notch structure can also be prevented. Also, if the first and second insulating films on the notch portion are formed of different materials, the height of the notch portion is controlled by adjusting the film thickness of the first insulating film. These layers are formed of the materials to which the selective etching can be applied mutually.

The control of the height and the depth of the notch portion decides the profile of the pocket regions that are formed by the ion implantation in the semiconductor substrate below the gate electrode. In order not to cause the shallow distribution of the pocket regions in the semiconductor substrate, it is important to control the height of the notch portion and the depth of the notch portion. The optimum values of them are given when an angle of the height H to the depth D of the notch portion becomes substantially equal to an angle θ (tan θ=D/H) of the oblique ion implantation with respect to the normal line of the wafer.

Also, the notches are formed under the first and second insulating films by forming the first and second insulating films on the surfaces of the gate electrode and the semiconductor substrate, then applying the unisotropic etching to the second insulating film to leave selectively on the sides of the gate electrode, and then applying the isotropic etching only to the first insulating film. Thus, the notch portions that have the uniform shape and size can be formed in the wafer (substrate) surface and in the region having the density difference. As a result, variation of the notch portions in the wafer surface can be prevented.

Therefore, the variation in the positions of the pocket regions formed in the semiconductor substrate become small by executing the oblique ion implantation while using the notch-containing structure as a mask. Thus, the characteristic of the transistor on the semiconductor wafer becomes uniform, without influenced by the pattern density on the wafer.

Moreover, since the depth of the notch portion under the insulating films in the lateral direction is easily controlled by adjusting the thicknesses of the first and second insulating films, variation in the notch structure can also be prevented.

Also, in the case that the first insulating film and the second insulating film made of different materials are to be formed on the side surfaces of the gate electrode like the visor, if the third insulating film made of the same material as the first insulating film is previously formed selectively on the side walls of the gate electrode and then the first insulating film and the second insulating film are formed sequentially, the thickness of the first insulating film on the side surfaces of the gate electrode can be increased substantially by the third insulating film. Thus, it can be facilitated to increase the depth of the notch portions in the lateral direction.

Besides, the notches are formed between the first and second insulating films on the side surfaces of the gate electrode and the upper surface of the semiconductor substrate by forming the first insulating film and the second insulating film on the surfaces of the gate electrode and the upper surface of the semiconductor substrate, then applying the unisotropic etching to the second insulating film to leave selectively on both sides of the gate electrode, then forming the extension regions constituting the source/drain by introducing the impurity into the semiconductor substrate via the first insulating film on the semiconductor substrate, and then applying the isotropic etching to the first insulating film.

Therefore, when the resist for covering the region into which the impurity ion implanted to form the extension regions should not be introduced is to be removed, the surface of the semiconductor substrate is protected by the first insulating film. As a result, the digging and the rough surface of the semiconductor substrate due to the dry process and the chemical process to remove the resist can be prevented.

DETAILED DESCRIPTION OF THE PREFERRED EMBODIMENTS

Embodiments of the present invention will be explained with reference to the accompanying drawings hereinafter.

(First Embodiment)

FIGS. 8A to 8C, FIG. 9, FIG. 10, FIG. 11, and FIGS. 12A and 12B are sectional views showing steps of manufacturing a semiconductor device according to a first embodiment of the present invention.

Figure 8A:
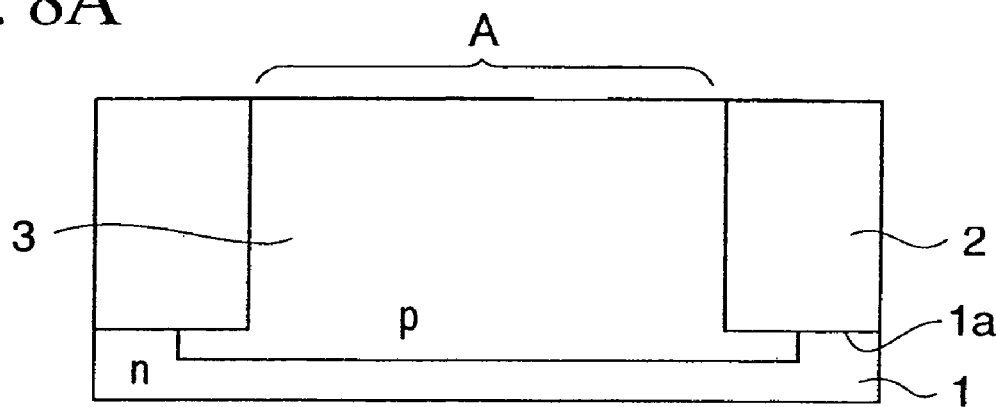
FIGS. 8A to 8M are sectional views showing steps of manufacturing a semiconductor device according to a first embodiment of the present invention.

First, steps required until the structure shown in FIG. 8A is formed will be explained hereunder.

An STI structure 2 is formed in the device isolation region by forming grooves 1a in the device isolation region, which surrounds an active region A, of a silicon (semiconductor) substrate 1 and then burying an insulating film in the grooves 1a. In this case, in place of the STI structure 2, other device isolation structures such as the device isolation layer formed by the LOCOS method, and others may be employed in the device isolation region.

Then, a well 3 is formed in the silicon substrate 1 by ion-implanting the impurity into the active region A. The formation of the well 3 is the well-known technology and thus the well 3 can be formed by any of the well-known methods.

In the first embodiment, explanation will be made by setting the silicon substrate 1 to the n-type and the active region A to the p-type. For example, boron is used as the p-type impurity employed to from the well 3. In this case, the n-type well may be formed in the n-type silicon substrate 1. Also, the silicon substrate 1 is set to the p-type, and the n-type or the p-type well may be formed in the active region.

Figure 8B:
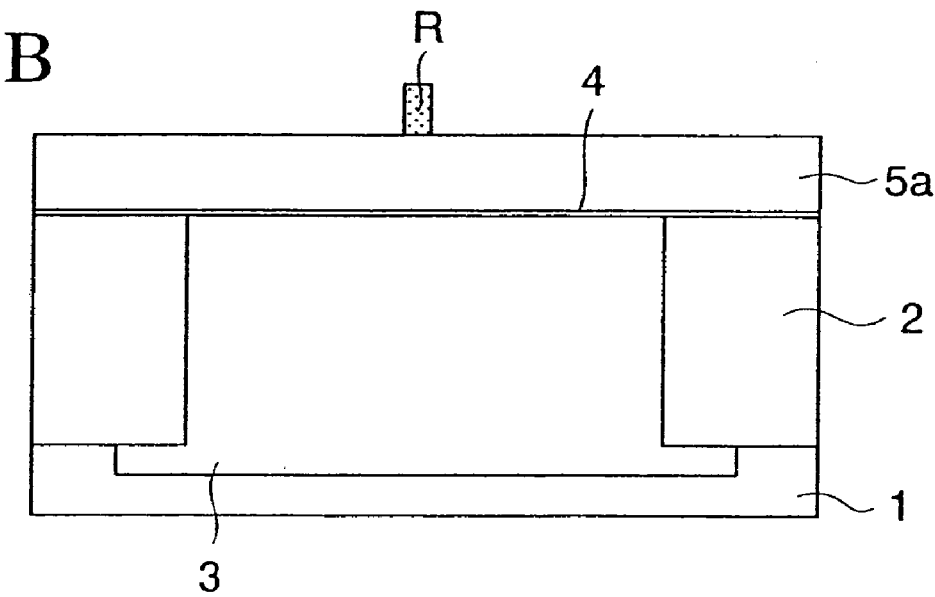

Then, as shown in FIG. 8B, a gate insulating film 4 is formed on a surface of the silicon substrate 1 to have a thickness of 1 to 2 nm. The gate insulating film 4 may be formed of any of the high dielectric film such as $Al_2O_3$, $HfO_2$, etc., the silicon oxide, the silicon nitride, and other insulating films.

In turn, a polysilicon film 5a of 150 nm in thickness, for example, is formed on the gate insulating film 4 by the CVD method. Then, a photoresist 6 is coated on the polysilicon film 5a, and then the photoresist 6 is exposed/developed into a gate profile to prepare for the gate patterning.

Figure 8C:
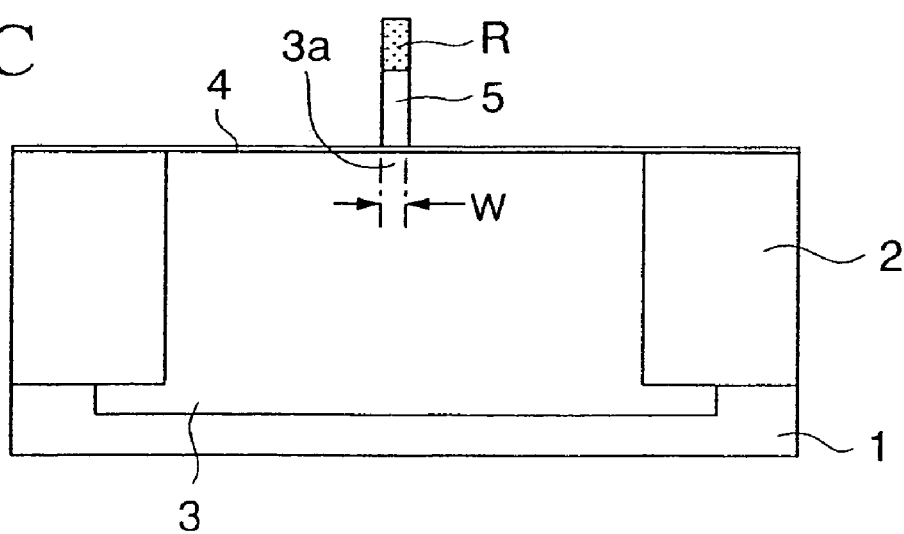

Then, as shown in FIG. 8C, the polysilicon film 5a is etched into a straight shape, i.e., a rectangular shape in section, by using the photoresist 6 as a mask. In this case, the etching is executed in the condition that the etching selective ratio of the polysilicon film 5a to the gate insulating film 4 is high such that a mixed gas of $HBr/O_2$, for example, is employed as the etching gas, etc. Thus, the polysilicon film 5a left under the photoresist 6 is used as a gate electrode 5. A width (gate length) w of the gate electrode 5 is set to 30 to 150 nm, for example. A region that is located under the gate electrode 3 and near a surface of the well 3 serves as a channel region 3a.

Figure 8D:
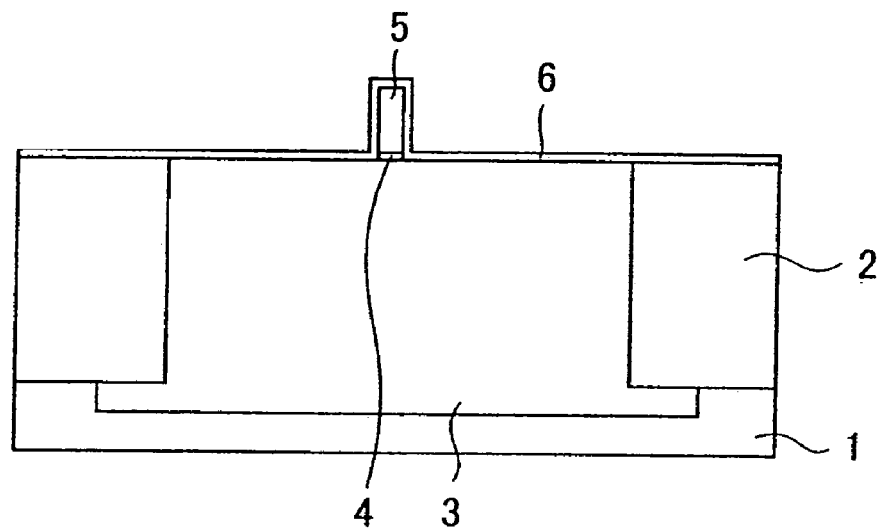

Then, the photoresist R is removed. Then, as shown in FIG. 8D, a silicon oxide film ($SiO_2$ film) 6 of 15 nm thickness is formed on the gate electrode 5 and the silicon substrate 1 by the low-pressure plasma CVD method using TEOS as the source, for example. The $SiO_2$ film 6 is formed thicker than the film thickness of the gate insulating film 4 on the silicon substrate 1.

Figure 8E:
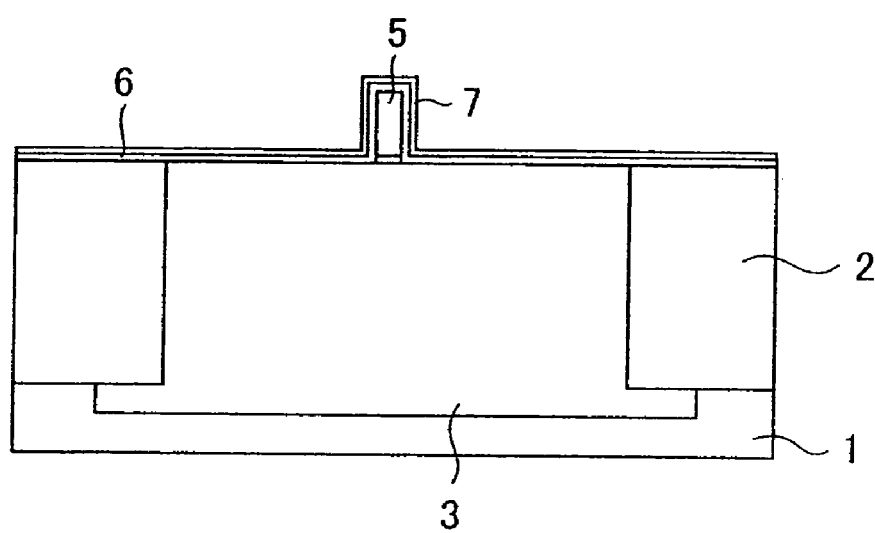

Then, as shown in FIG. 8E, a silicon nitride film ($Si_3N_4$ film) 7 of 5 nm thickness, for example, is formed on the silicon oxide film 6 by the CVD method using silane ($SiH_4$) and ammonia ($NH_3$). If this silicon nitride film 7 is used as an overlying insulation film and this silicon oxide film is used as an underlying insulation film, the overlying insulation film and the underlying insulation film should be formed of the material that permits the selective etching of the underlying insulation film to the overlying insulation film.

Figure 8F:
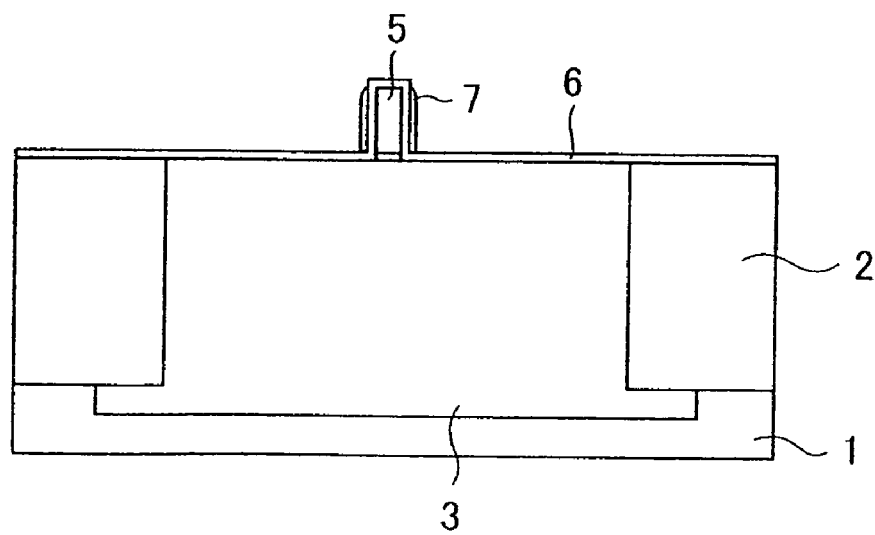

Then, as shown in FIG. 8F, the silicon nitride film 7 is left on side walls of the gate electrode 5 by applying the unisotropic etching in the direction perpendicular to the upper surface of the silicon substrate 1.

Figure 8G:
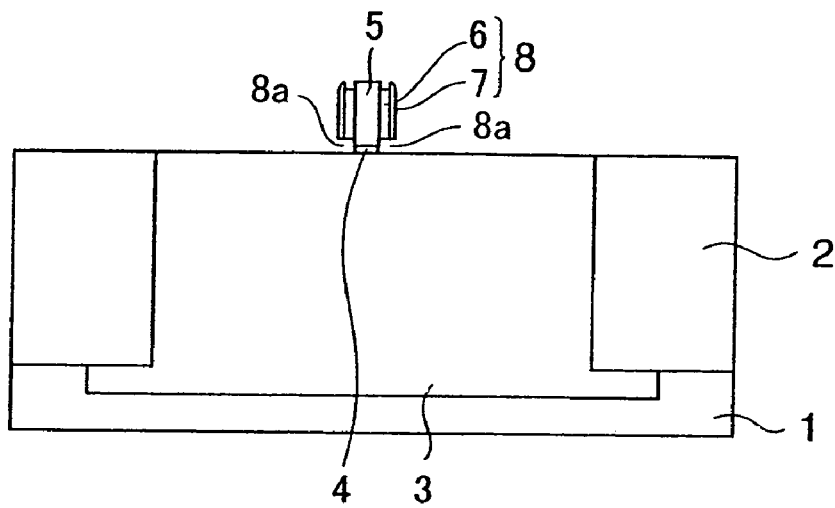

Then, as shown in FIG. 8G, the silicon oxide film 6 is isotropically etched by using the chemicals such as 0.5% HF (hydrofluoric acid), or the like. In this case, the silicon oxide film 6 is selectively left on side surfaces of the gate electrode 5 by using the silicon nitride film 7 left on the side surfaces of the gate electrode 5 as a mask. In this case, the etching conditions must be set such that a space 8a having a height, which is higher than a thickness of the gate insulating film 4, between the silicon oxide film 6 and the upper surface of the silicon substrate 1 on the side of the gate electrode 5 can be formed. In other words, the portion of the silicon oxide film 6, which is covered with the silicon nitride film 7, is not etched by the chemicals, but the portion of the silicon oxide film 6, which is not covered with the silicon nitride film 7, is isotropically etched. In this case, the etching is not affected by the density difference of the gate electrode and the in-plane distribution since the wet etching is applied.

If the method of etching the silicon oxide film 6 under the condition that the etching selective ratio to the gate electrode 5 and the silicon nitride film 7 is high may be employed, the dry etching may be applied.

According to the above etching, the upper surface and the lower portion of the side surfaces of the gate electrode 5 are exposed.

Since the silicon oxide film 6 is removed from the surface of the silicon substrate 1, the space 8a is also formed between the silicon nitride film 7 on the side surfaces of the gate electrode 5 and the silicon substrate 1. In this case, the silicon oxide film 6 and the silicon nitride film 7 left on the side surfaces of the gate electrode 5 are used as an ion-implantation controlling film 8. If the gate electrode 5 and the ion-implantation controlling film 8 are regarded as one structure, the space 8a that is formed at the lower portion of the ion-implantation controlling film 8 corresponds to the notch portion 103a shown in FIG. 1A. Therefore, the space 8a is also referred to as the notch portion hereinafter. The space 8a has a height higher than the thickness of the gate insulating film 4.

By the way, if the silicon oxide film 6 is subjected to the wet etching, there is such a possibility that, since the gate insulating film 4 is etched in the lateral direction of the gate electrode 5, the breakdown voltage between the gate electrode 5 and the silicon substrate 1 is lowered. As the countermeasure against this, first, if the silicon oxide film 6 is formed by the low pressure CVD method using TEOS, the etching selective ratio to the gate insulating film 4 formed of the high-temperature oxide film (HTO) can be assured in the wet etching of the silicon oxide film 6. Second, if the HTO film whose wet etching rate is close to the gate insulating film 4, for example, is employed as the silicon oxide film 6, the method of forming the silicon oxide film serving as the gate insulating film 4 between the gate electrode 5 and the silicon substrate 1 can be employed by forming the notch portion 8a by the wet etching and then annealing the device once again in the oxidizing atmosphere.

Figure 9:
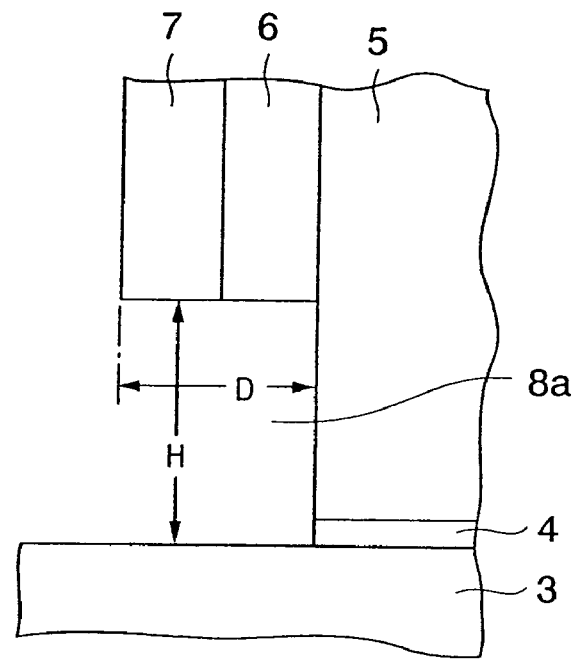
FIG. 9 is a fragmental enlarged sectional view showing a notched structure according to the first embodiment of the present invention.

A lateral depth D and a vertical height H of the notch portion 8a shown in FIG. 9 depend on the growth conditions and the film thickness of the silicon nitride film 7 and the silicon oxide film 6. The height H of the notch portion 8a is decided by the film thickness of the silicon oxide film 6. Also, the depth D of the notch portion 8a is decided by the growth conditions of the silicon oxide film 6 and the growth conditions of the silicon nitride film 7. A ratio $\beta/\alpha$ of to the film thickness $\beta$ on the upper surface of the silicon substrate 1 to the film thickness $\alpha$ on the side surface of the gate electrode 5 (referred to as a "coverage" hereinafter), for example, can be changed by adjusting the growth conditions such as the growth pressure, the temperature, the flow rate, the gas type, etc.

Figure 8H:
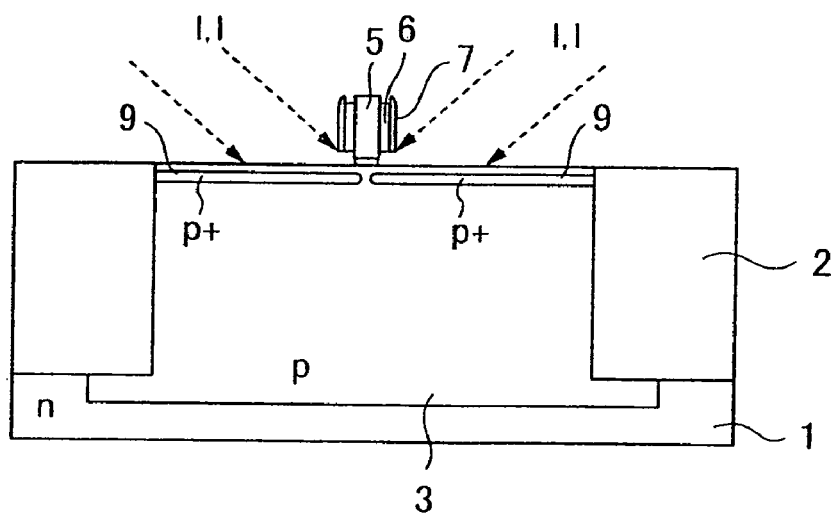

Then, as shown in FIG. 8H, the impurity having the same conductivity type as the well 3, for example, the p-type impurity such as the boron, is ion-implanted in the oblique direction to the upper surface of the silicon substrate 1. In this case, the gate electrode 5 and the ion-implantation controlling film 8 function as a mask for the notched structure.

In this case, the impurity ion as the p-type impurity is ion-implanted up to a predetermined depth from the surface of the silicon substrate 1 on both sides of the ion-implantation controlling film 8 and the gate electrode 5. Also, the impurity is ion-implanted into the silicon substrate 1 below the gate electrode 5 up to a predetermined depth via the notch portion 8a under the ion-implantation controlling film 8. Also, a part of the ions that are obliquely implanted into the corners of the lower ends of the ion-implantation controlling film 8 loses the energy when it passes through the ion-implantation controlling film 8, and reaches the notch portion 8a thereunder, otherwise a part of the ions is absorbed by the gate electrode 5 not to reach the silicon substrate 1.

Figure 5:
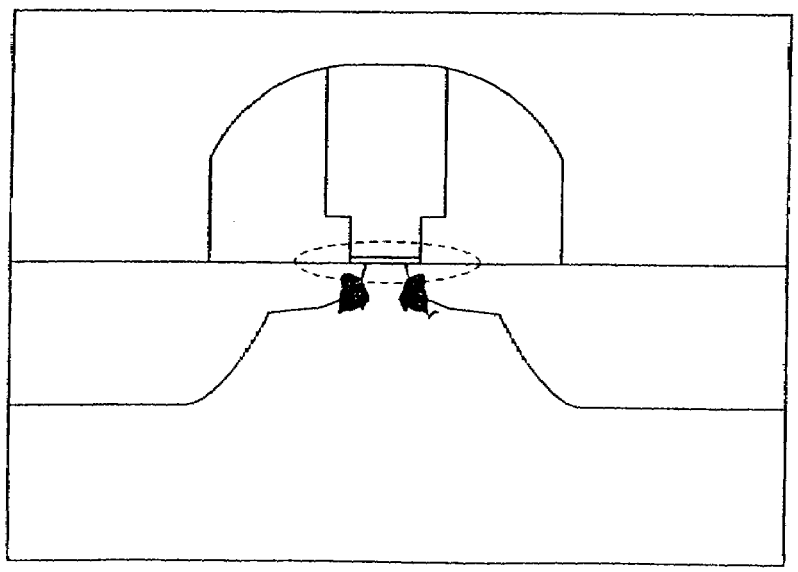
FIG. 5 is a view showing the impurity concentration distribution in the MOS transistor when the ion implantation shown in FIGS. 4A and 4B is employed.
Figure 4A:
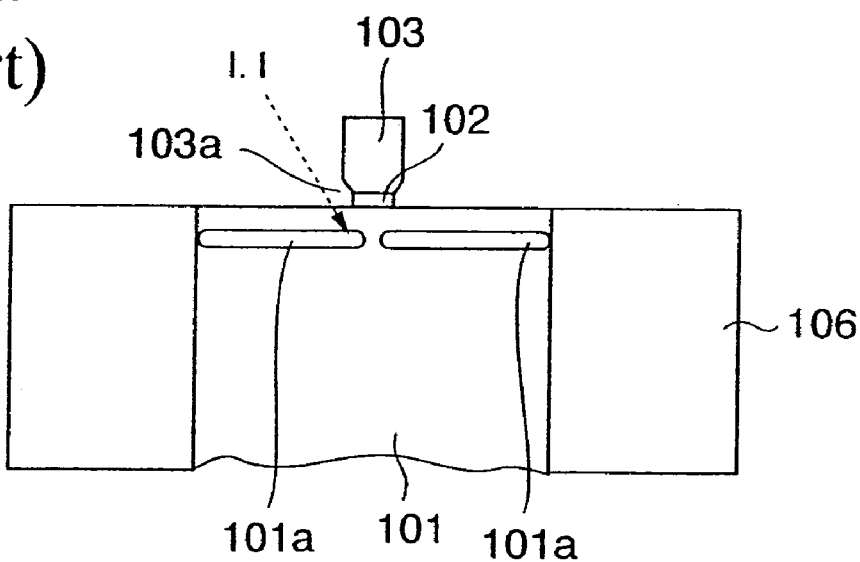
FIGS. 4A and 4B are sectional views showing the ion-implanting state for the pocket formation by using the notch-type gate electrode as a mask.
Figure 4B:
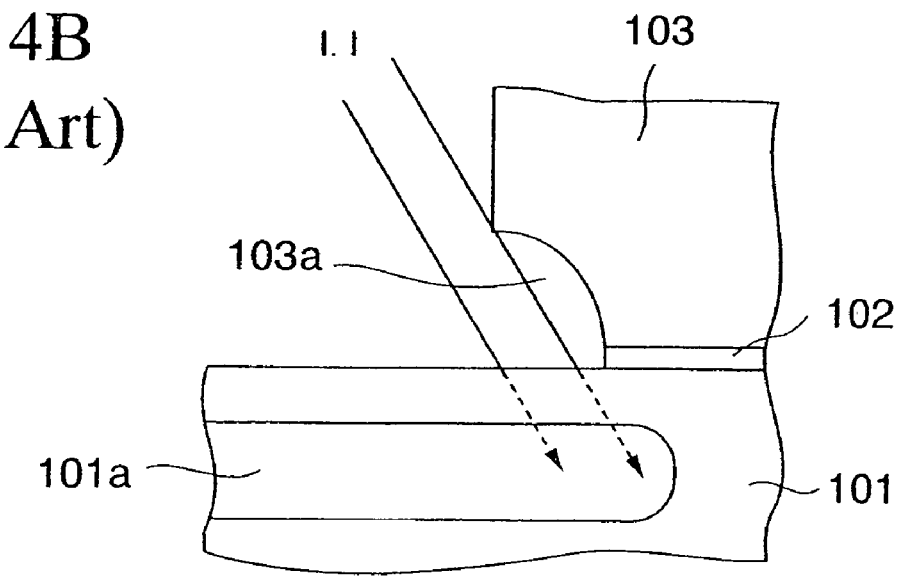
Figure 6A:
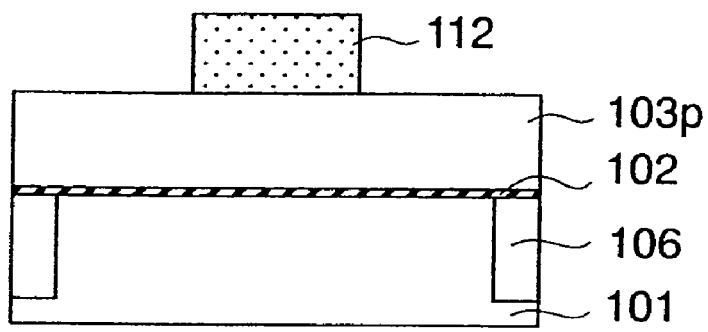
FIGS. 6A to 6D are sectional views showing steps of forming the notch-type gate electrode.
Figure 6B:
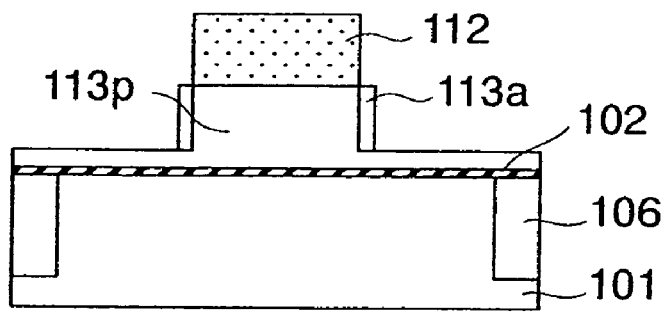
Figure 6C:
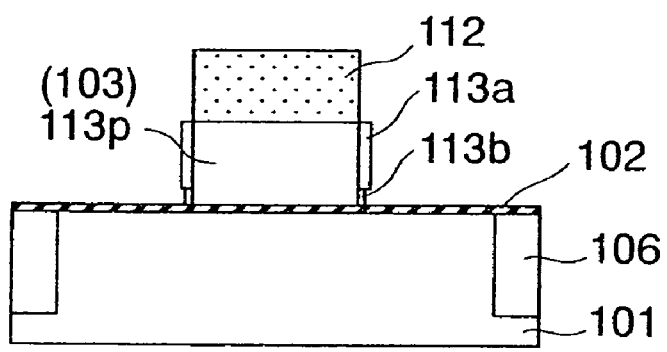
Figure 6D:
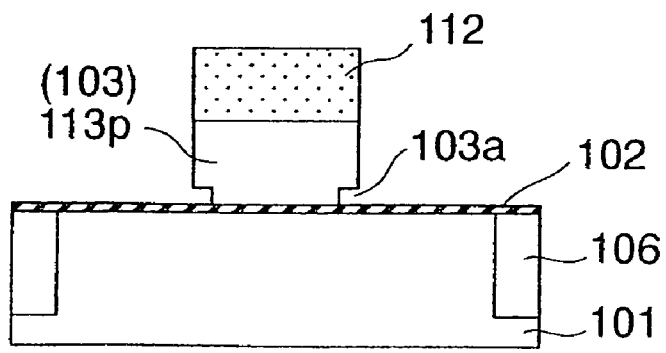
Figure 7A:
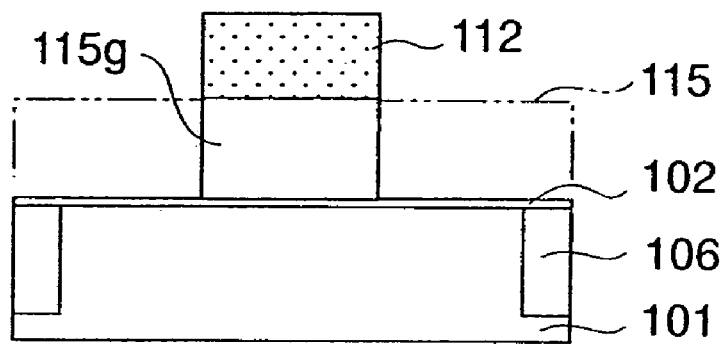
FIGS. 7A to 7C are sectional views showing another ion implanting method for the pocket formation in the prior art.
Figure 7B:
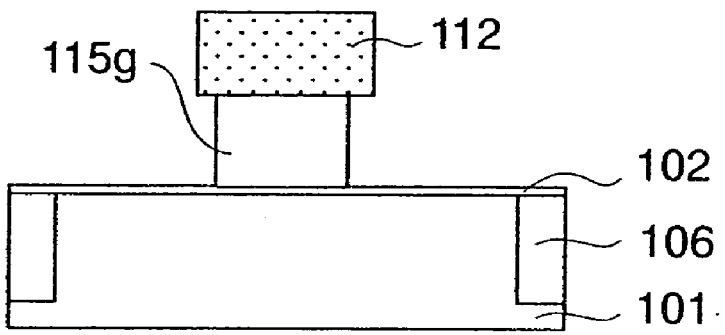
Figure 7C:
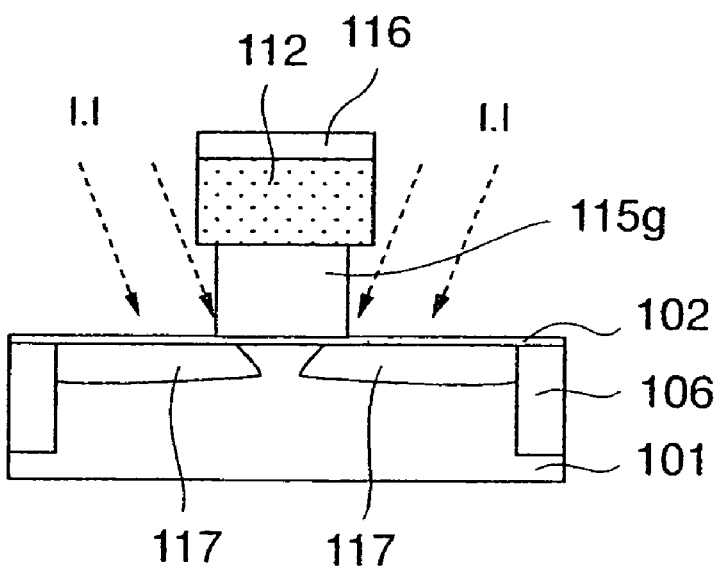

Accordingly, like the structure shown in FIG. 5, pocket regions 9 whose p-type impurity concentration is higher than the channel region 3a are formed in the silicon substrate 1 at a predetermined depth from the surface of the silicon substrate 1. That is, the pocket regions 9 are formed below the gate electrode 5 at the position that is lower than the channel region 3a.

Figure 8I:
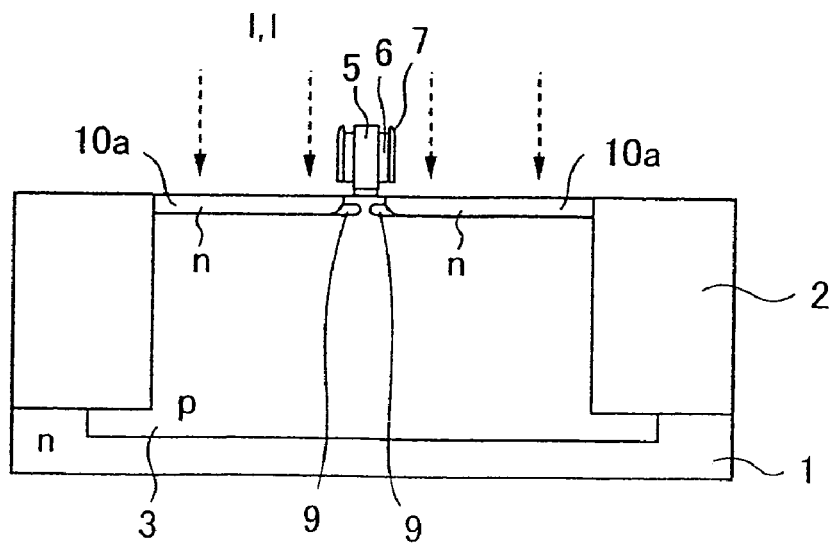

Then, as shown in FIG. 8I, the n-type impurity such as arsenic, phosphorus, or the like is ion-implanted in the direction substantially perpendicular to the silicon substrate 1 by using the gate electrode 5 and the ion-implantation controlling film 8 as a mask. Thus, extension regions 10a serving as the source/drain are formed in the silicon substrate 1 on both sides of the gate electrode 5.

Two n-type extension regions 10a are formed at a distance below the gate electrode 5. The p-type pocket regions 9 are connected to the end portions of the extension regions 10a below the gate electrode 5.

If the n-MOS transistor is to be formed, the arsenic ion $(As^+)$, for example, is implanted at the acceleration energy of 10 keV, the dosage of $1 \times 10^{15}$ cm$^{-2}$, and the tilt angle of 0 as the ion implantation to form the extension regions 10a and also the boron ion $(B^+)$, for example, is implanted along four directions at the acceleration energy of 10 keV, the dosage of $1 \times 10^{13}$ cm$^{-2}$, and the tilt angle of 20 as the ion implantation to form the pocket regions 9. These ion implantations are carried out while covering the n-type well with the same mask. This tilt angle is the angle that is measured from the normal direction of the surface of the silicon substrate 1.

Also, if the p-MOS transistor is to be formed, the boron ion $(B^+)$, for example, is implanted at the acceleration energy of 2 keV, the dosage of $1 \times 10^{15}$ cm$^{-2}$, and the tilt angle of 0 as the ion implantation to form the extension regions 10a and also the arsenic ion $(As^+)$, for example, is implanted along four directions at the acceleration energy of 50 keV, the dosage of $1 \times 10^{13}$ cm$^{-2}$, and the tilt angle of 20 as the ion implantation to form the pocket regions 9. These ion implantations are carried out while covering the p-type well with the same mask.

After these ion implantations, the silicon substrate 1 is annealed at 950° C. for 10 seconds, for example, to activate the impurity.

Meanwhile, in the notched structure, if the ion implantation is carried out at the oblique angle such as the tilt angle of about 20, the ion can be implanted in desired regions near the end portions of the extension regions 10a, but the ion can be prevented from being implanted into the region, which is located below the gate electrode 5 and in which the ion should not be implanted, since the ion-implantation controlling film 8 of the notched structure acts as the offset. If the variation in the surface of the silicon substrate 1 of the notched structure and the variation due to the density difference of the patterns can be eliminated, the injection of the ion into the silicon substrate 1 by virtue of the ion implantation in the oblique direction become equal, and therefore the variation in the transistor characteristics can be reduced.

Figure 8J:
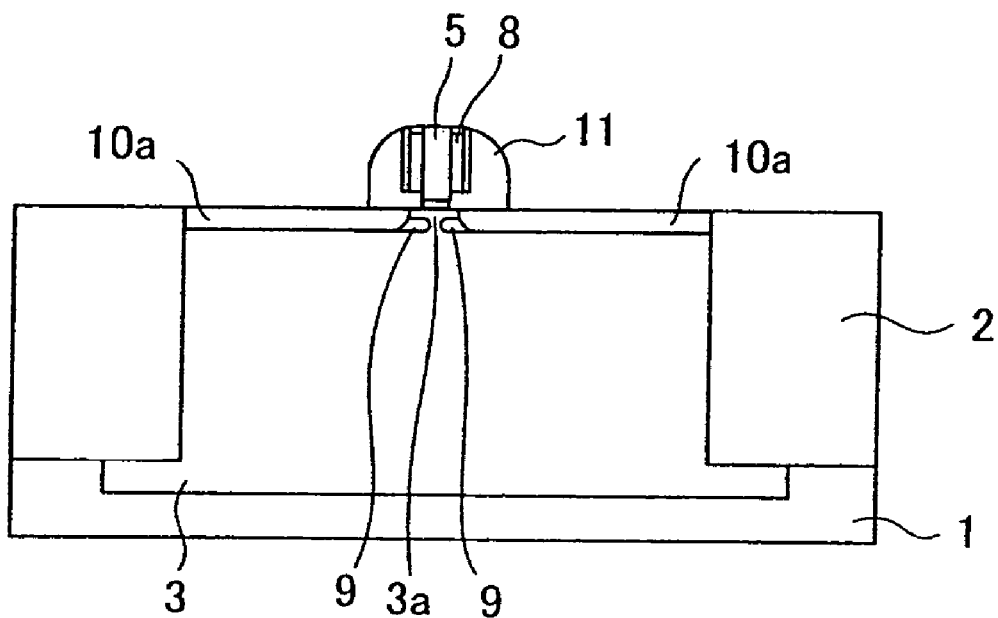

Next, steps required until the structure shown in FIG. 8J is formed will be explained hereunder.

First, a silicon oxide film for covering the gate electrode 5 and the ion-implantation controlling film 8 is formed on the overall surface of the silicon substrate 1 to have a thickness of 100 nm. This silicon oxide film is formed by the low pressure CVD method using TEOS, for example. Then, the silicon oxide film is etched in the almost perpendicular direction by using a gas such as $CHF_3/Ar/O_2$, etc. so as to leave only on the side surfaces of the gate electrode 5 as insulating sidewall spacers 11.

Figure 8K:
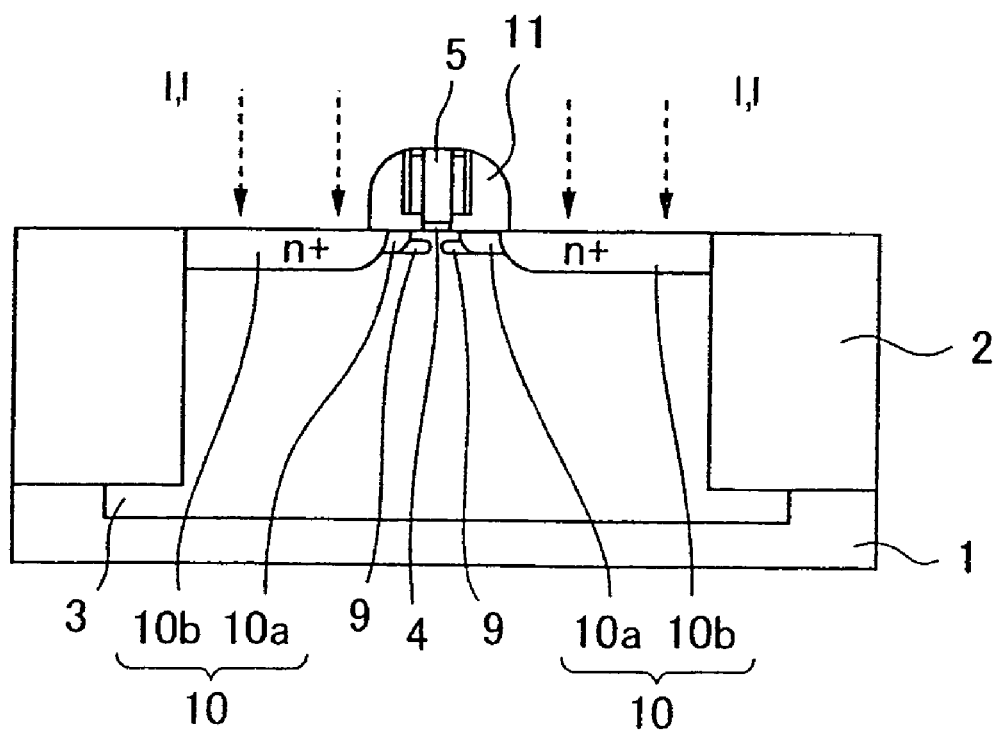

Then, as shown in FIG. 8K, n-type high concentration impurity regions 10b serving as the source/drain are formed by ion-implanting the n-type impurity into the silicon substrate 1 while using the gate electrode 5 and the sidewall spacers 11 as a mask. For example, the boron ion $(B^+)$ is implanted under the conditions of 5 keV and $5 \times 10^{15}$ cm$^{-2}$ if the well 3 below the gate electrode 5 is the n-type, whereas the phosphorus ion $(P^+)$ is implanted under the conditions of 20 keV and $5 \times 10^{15}$ cm$^{-2}$ if the well 3 below the gate electrode 5 is the p-type. After this, in order to activate the impurity, the silicon substrate 1 is annealed at 1000° C. for 5 seconds.

The impurity diffusion regions 10 having the LDD structure are constructed by the high concentration impurity region 10b and the extension region 10a, which have the opposite conductivity type to such well 3, respectively.

As a result, the MOS transistor having the gate electrode 5, the impurity diffusion regions 10 serving as the source/drain and having the LDD structure, and the pocket region 9 is formed in respective active regions of the silicon substrate 1.

Figure 8L:
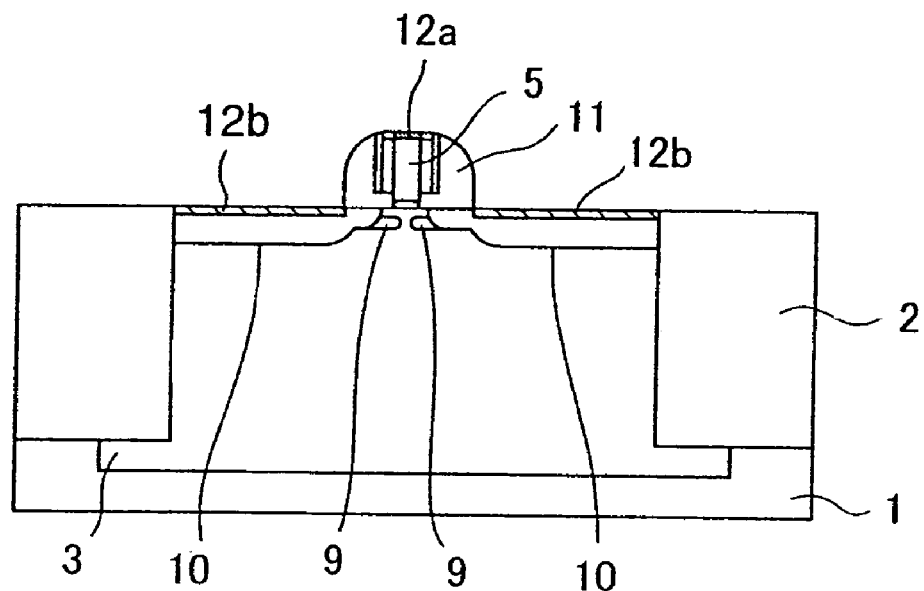

Then, as shown in FIG. 8L, a metal film such as titanium, cobalt, nickel, etc. is formed on the silicon substrate 1, the gate electrode 5, and the sidewall spacers 11. Then, the metal film and the silicon are alloyed by the annealing, so that silicide layers 12a, 12b are formed on the gate electrode 5 and the impurity diffusion regions 10 respectively. Then, the unreacted metal film is removed.

Figure 8M:
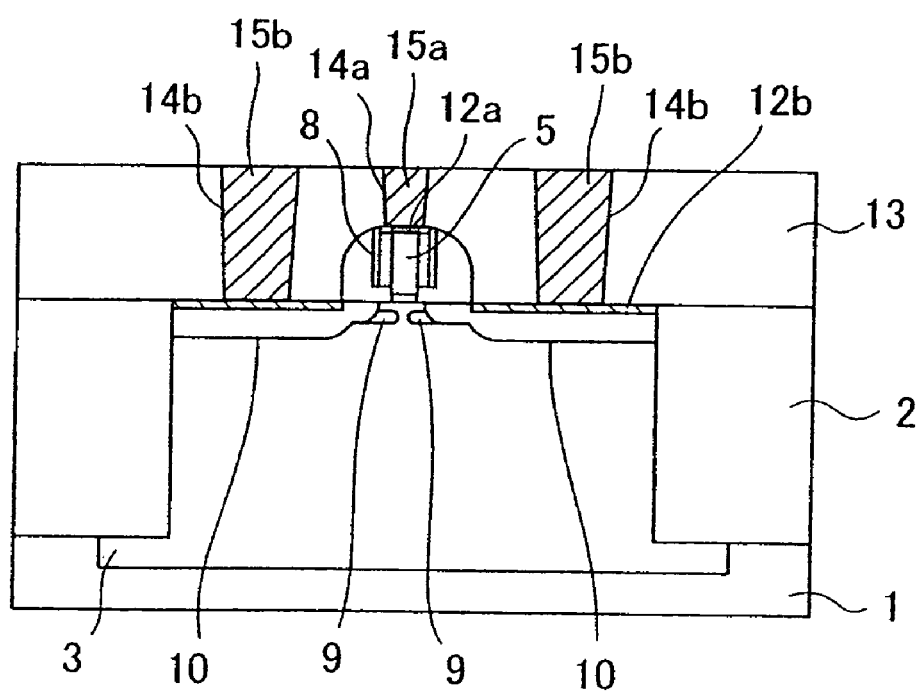

Then, as shown in FIG. 8M, an interlayer insulating film 13 for covering the gate electrode 5 is formed on the silicon substrate 1. Then, contact holes 14a, 14b are formed on the gate electrode 5 and the impurity diffusion regions 10 by patterning this interlayer insulating film 13 respectively. Then, conductive plug 15a, 15b are formed in the contact holes 14a, 14b. After this, a wiring structure is formed on the interlayer insulating film 13, but its details will be omitted.

According to the above steps, the notch portion is not formed at the lower portion of the gate electrode 5 itself, but the notch portion 8a is formed at the lower portion of the ion-implantation controlling film 8 formed on the side surfaces of the gate electrode 5.

Therefore, there is no necessity to employ the prior art such that the gate electrode 5 is patterned by the unisotropic etching and then the width of the gate electrode 5 is adjusted by the wet or dry isotropic etching. Thus, the in-plane distribution of the gate electrode 5 that is formed on the silicon substrate 1 by the unisotropic etching only can be made uniform. As a result, the variation of the transistor characteristics can be prevented and also the transistor characteristics can be stabilized.

If the gate electrode 5 and the ion-implantation controlling film 8 are used as a mask to form the pocket regions 9, the mask is formed as the structure that has the notch portion 8a at its lower portion. Therefore, two pocket regions 9 that are formed in the silicon substrate 1 on both sides of the gate electrode 5 by ion-implanting the impurity into the silicon substrate 1 from the oblique direction are not formed shallow below the gate electrode 5 and come close to each other.

Figure 10:
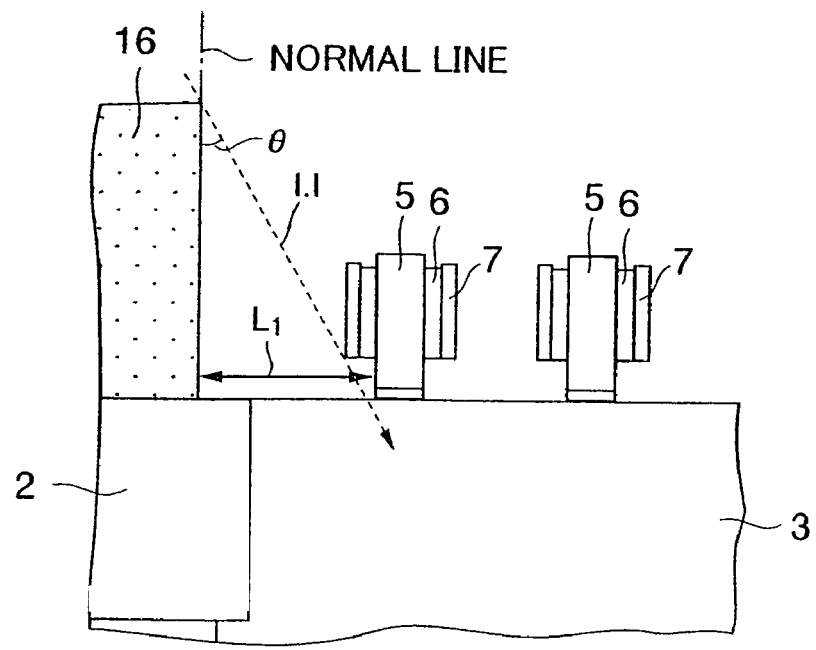
FIG. 10 is a sectional view showing an ion implantation angle for the pocket formation according to the first embodiment of the present invention.

In the meanwhile, as shown in FIG. 10, in the densest gate pattern, the ion implantation applied to the surface of the silicon substrate 1 in the oblique direction is disturbed the height of the resist 16 used as a mask in the ion implantation or the neighboring gate electrode 5 in some cases. The height of the resist 16 is higher than that of the gate electrode 5.

In the densest gate pattern region, the pattern area of the gate electrode 5 must be reduced to the lowest minimum. Therefore, a distance L1 between the resist 16 and the closest gate electrode 5 cannot be assured only by a length that is smaller than three times of the height of the gate electrode 5. Therefore, the implanting angle from the normal on the silicon substrate 1, that can be employed in the ion implantation applied from the oblique direction, is less than 45.

Meanwhile, in the notched structure mentioned above, the height H of the notch portion 8a is decided by the film thickness of the silicon oxide film 6 and also the depth D of the notch portion 8a is decided by the growth conditions (coverage) of the silicon oxide film 6 and the growth conditions (coverage) of the silicon nitride film 7. Therefore, it is needed that the thickness of the silicon oxide film 6 should be thicker than or almost equal to the thickness of the silicon nitride film 7 on the side surfaces of the gate electrode 5 and on the upper surface of the silicon substrate 1.

Figure 11:
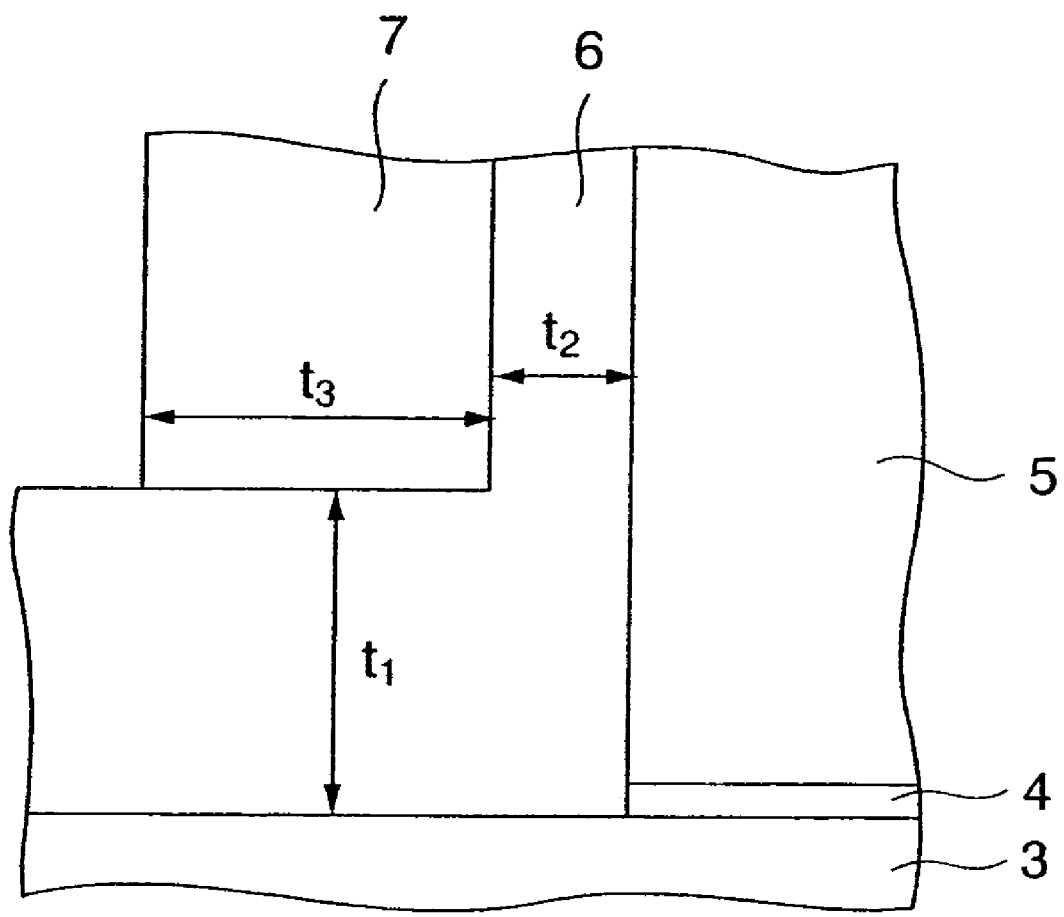
FIG. 11 is a sectional view showing a film thickness of an insulating film of the notch structure according to the first embodiment of the present invention.

For example, as shown in FIG. 11 illustrating the neighboring of the lower portion of the gate electrode 5 in an enlarged fashion, if the film thickness $t_1$ of the silicon oxide film 6 on the upper surface of the silicon substrate 1 is largely thicker than the film thickness $t_2$ of the silicon oxide film 6 on the side surfaces of the gate electrode 5 ($t_1 \gg t_2$), the etching residue of the silicon oxide film 6 is ready to occur under the silicon nitride film 7 when the silicon oxide film 6 is etched by using the silicon nitride film 7 as a mask, which causes the variation at the pocket region 9 forming position below the gate electrode 5.

Also, if the coverage $t_1/t_2$ of the silicon oxide film 6 is increased, the distribution of the film thickness of the silicon oxide film 6 on the substrate becomes uneven because of the density difference of plural gate electrodes 5 on the silicon substrate 1, and thus variations in the depth D and the height H of the notch portion 8a are caused. For this reason, the growth conditions to give the poor coverage of the silicon oxide film 6 are not employed.

According to such reason, the film thickness structure shown in FIG. 25 in Patent Application Publication (KOKAI) 2000-269500 cannot be employed as the mask to form the pocket region since the silicon nitride film becomes thicker than the silicon oxide film.

By the way, if the film thickness $t_1$ of the silicon oxide film 6 on an upper surface of the silicon substrate 1 and the film thicknesses $t_2$, $t_3$ of the silicon oxide film 6 and the silicon nitride film 7 on the side walls of the gate electrode 5 are selected properly, lower portions of the side surfaces of the gate electrode 5 may be covered with the silicon oxide film 6 by the following method.

First, as shown in FIG. 8E, the gate electrode 5 is formed on the silicon substrate 1 via the gate insulating film 4, then the silicon oxide film 6 is formed on a surface of the gate electrode 5 and an upper surface of the silicon substrate 1 to have a thickness of 15 nm, for example, and then the silicon nitride film 7 is formed on the silicon oxide film 6 to have a thickness of 5 nm, for example. Then, as shown in FIG. 8F, the silicon nitride film 7 is left selectively on sides of the gate electrode 5 by unisotropic-etching the silicon nitride film 7 in the substantially vertical direction. In this case, the silicon oxide film 6 is grown by the low-pressure CVD method using the TEOS gas.

Then, the silicon oxide film 6 is wet-etched by using the chemical such as 0.5% concentration hydrofluoric acid (HF), or the like.

Figure 12A:
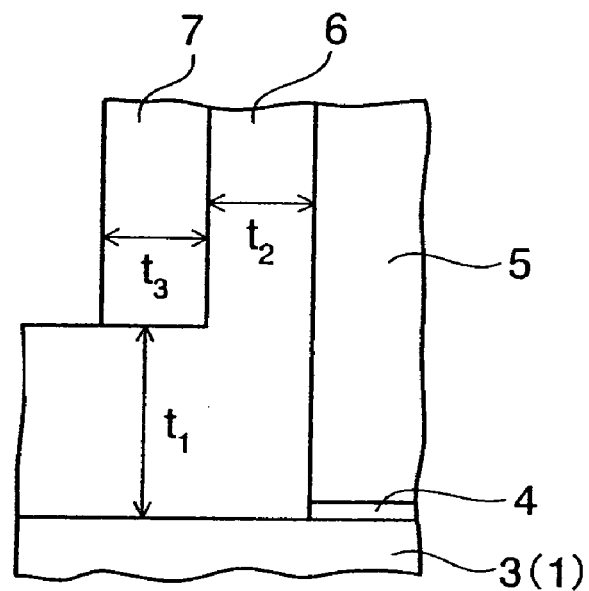
FIGS. 12A to 12E are sectional views showing states of forming the notch structure according to the first embodiment of the present invension.
Figure 12B:
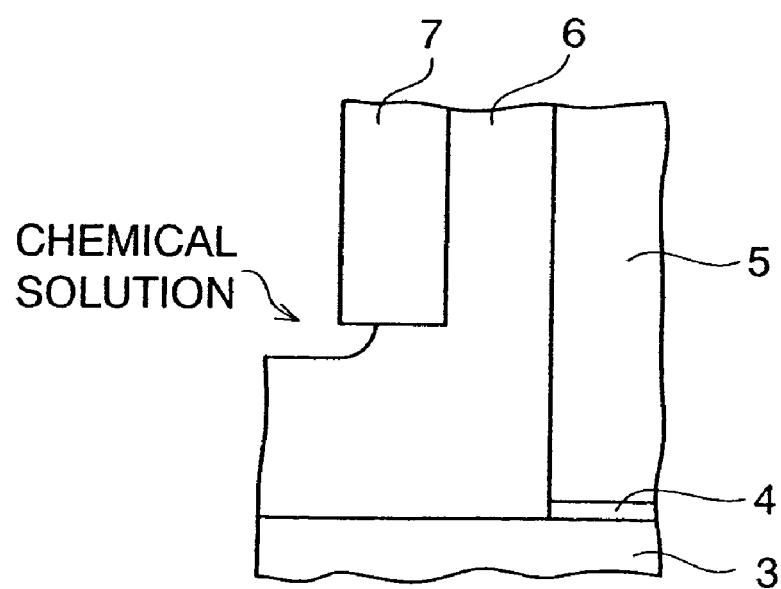

In this etching, as shown in FIGS. 12A and 12B in an enlarged manner, at first the silicon nitride film 7 acts as a mask, and the etching of the silicon oxide film 6 proceeds equally to the normal direction to the upper surface of the silicon substrate 1 and the horizontal direction. In this case, if the etching rate of the silicon oxide film 6, which is formed by the low-pressure CVD method using the TEOS, by the hydrofluoric acid is set to 0.1 mm/sec, it takes 150 sec to wet-etch the silicon oxide film 6 of 15 nm thickness in the lateral direction.

Figure 12C:
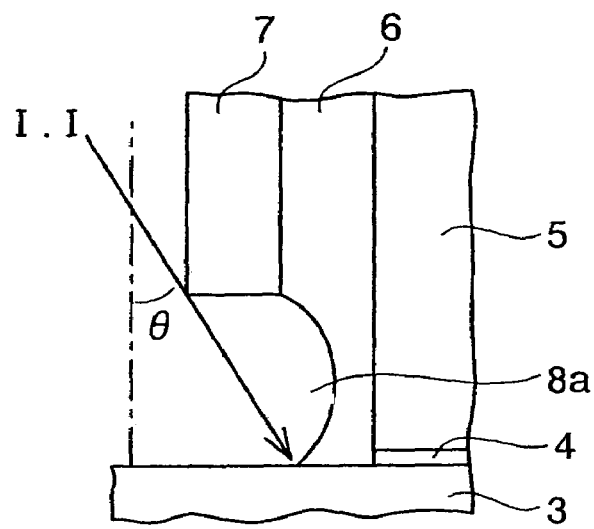
Figure 12D:
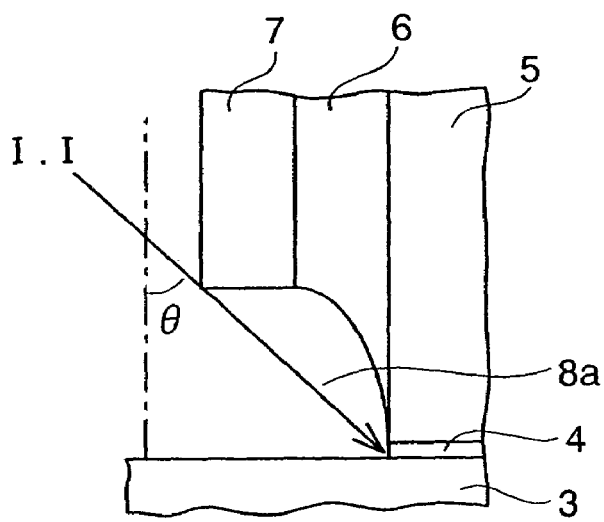

However, as shown in FIG. 12C, it becomes difficult for the chemical to be exchanged in the notch portion 8a as a depth of the notch portion 8a formed on the lower side portions of the gate electrode 5 is increased. As a result, as shown in FIG. 12D, the event that the etching rate of the silicon oxide film 6 becomes small on and under the notch portion 8a is brought about. In particular, since the silicon nitride film 7 serving as a mask disturbs the supply of the chemical over the notch portion 8a, the etching rate of the silicon oxide film 6 becomes smallest.

Figure 12E:
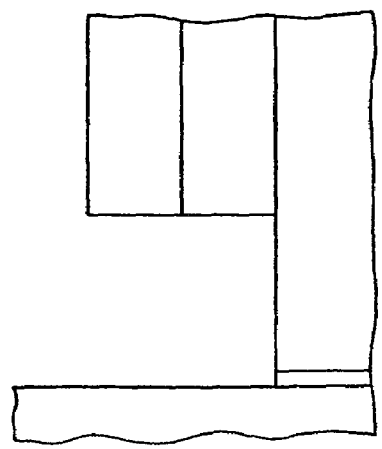

If the etching of the silicon oxide film 6 by using the chemical is still continued, side walls of the gate electrode 5 and the gate insulating film 4 are exposed, as shown in FIG. 12E. Then, if the supply of the chemical to the inside of the notch portion 8a is further continued, the gate insulating film 4 positioned below the silicon nitride film 7 is etched gradually from its side portion, although not particularly shown.

If the gate insulating film 4 is etched, the characteristics of the MOS transistor are deteriorated. Therefore, it is preferable that the etching of the silicon oxide film 6 below the silicon nitride film 7 should be stopped not to expose the side surfaces of the gate electrode 5. In this case, as shown in FIG. 12C or FIG. 12D, if the angle θ of the ion-implantation I.I to the normal line of the silicon substrate 1 is smaller than an angle $\tan^{-1}(t_2+t_3)/t_1$ indicated the film thickness in FIG. 12A in the ion-implantation to form the pocket region 9, the silicon oxide film 6 may be left such that the side surface of the notch portion 8a is formed like an almost C-shape, as shown in FIG. 12C.

Also, if $\theta = \tan^{-1}(t_2+t_3)/t_1$ is given, it is preferable that the etching of the silicon oxide film 6 should be stopped on the side of the notch portion 8a such that, as shown in FIG. 12D, the silicon oxide film 6 is left on the sides of the gate electrode 5 to have a thickest thickness at its top position and a thinnest thickness at its bottom position. If the etching is stopped in the state shown in FIG. 16B, the gate insulating film 4 made of the high-temperature oxide film is seldom etched.

In this case, in order to grow the silicon oxide film 6, TEOS, oxygen, helium as the reaction gas is used, the substrate temperature is set to 600 to 700° C., and the low pressure CVD method is used.

In this case, after the notch structure consisting of the gate electrode 5 and the ion-implantation controlling film 8 is completed, the ion-implantation controlling film 8 may be formed of the silicon oxide film 6 only by removing the silicon nitride film 7. Since the surface of the silicon substrate 1 becomes rough when the silicon nitride film 7 is removed, the silicon nitride film 7 must be previously formed thin to remove easily the roughness. Also, since the depth D of the notch portion 8a is easily changed when the silicon nitride film 7 is removed, the influence of the removal of the silicon nitride film 7 must be reduced by not only forming the silicon nitride film 7 thin but also forming the silicon oxide film 6 sufficiently thick.

Figure 13A:
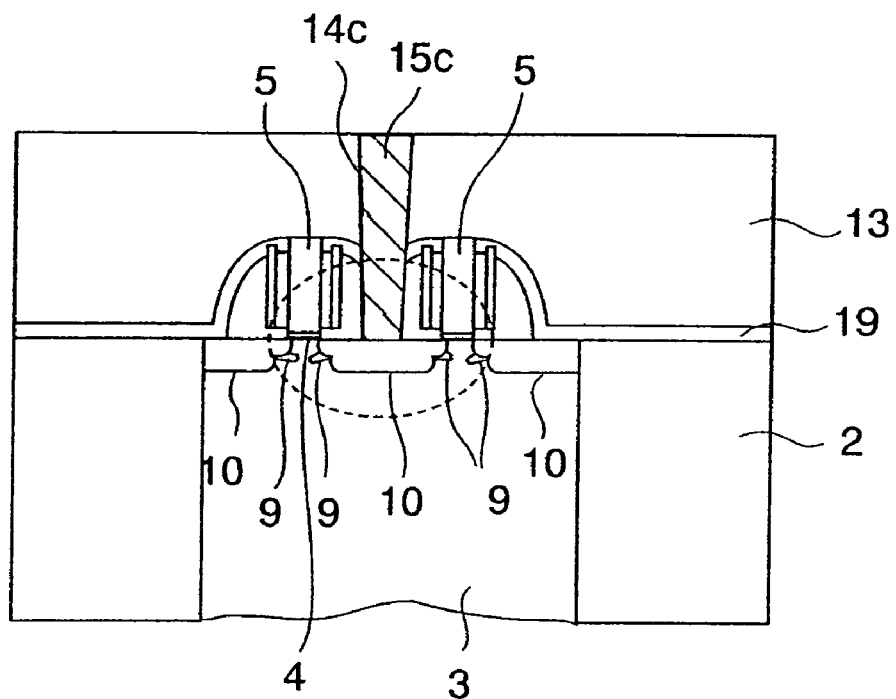
FIG. 13A is a sectional view showing a semiconductor device according to the first embodiment of the present invention.
Figure 13B:
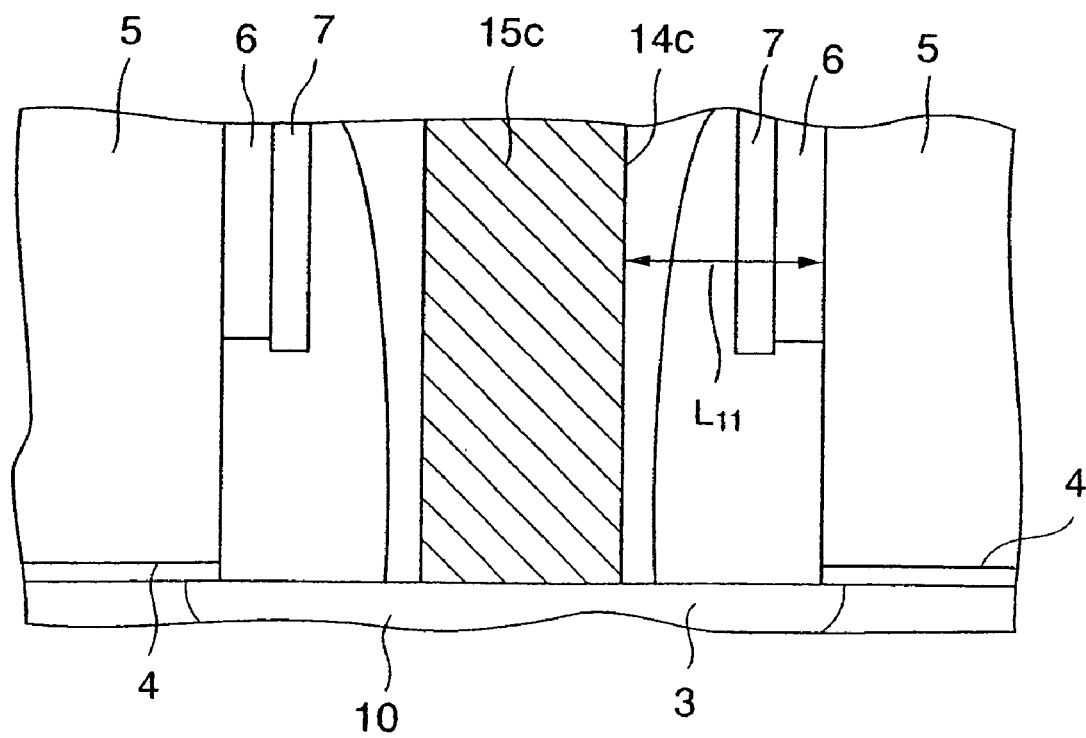
FIG. 13B is a fragmental enlarged sectional view of FIG. 13A.

In the semiconductor devices such as SRAM, DRAM, FeRAM, etc., as shown in FIG. 13A, the structure in which two MOS transistors are formed in one active region of the memory cell region is employed. In this case, the common impurity diffusion region 10 is formed between two gate electrodes 5 in one active region, and a bit-line contact hole 14c is formed in an interlayer insulating film 13 on the impurity diffusion region 10. A plug 15c made of the impurity-containing silicon or the metal is formed in the bit-line contact hole 14c. FIG. 13B shows a distance $L_{11}$ between the gate electrode 5 and the contact hole 14c in the notched gate structure according to the first embodiment.

Figure 1A:
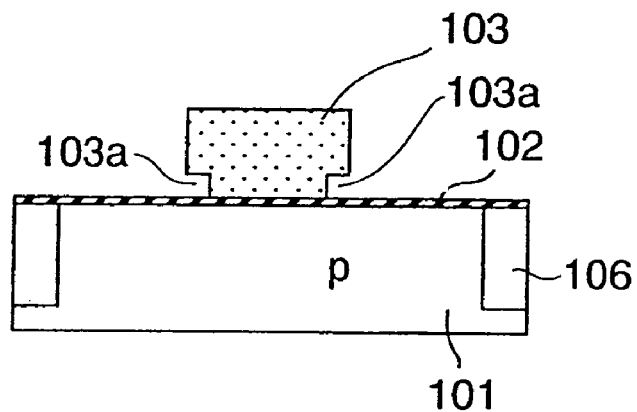
FIGS. 1A to 1D are sectional views showing a method of forming the MOS transistor having the notch-type gate electrode in the prior art.
Figure 1B:
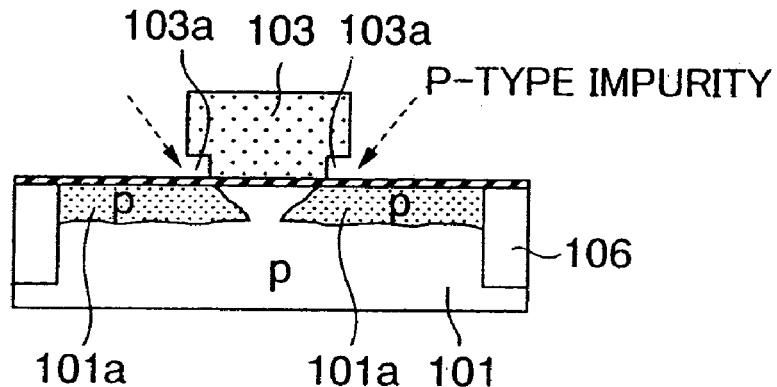
Figure 1C:
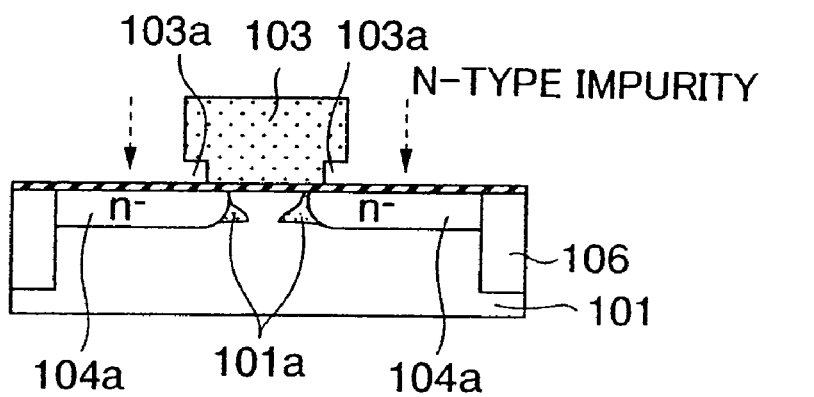
Figure 1D:
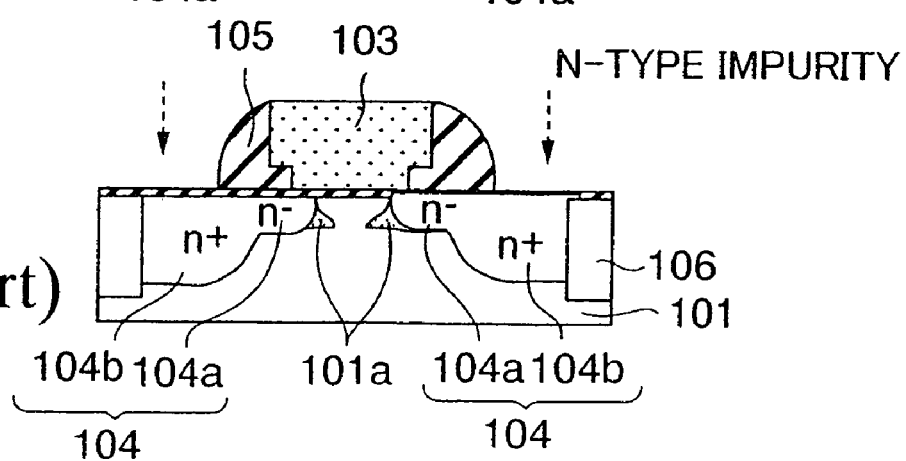
Figure 2A:
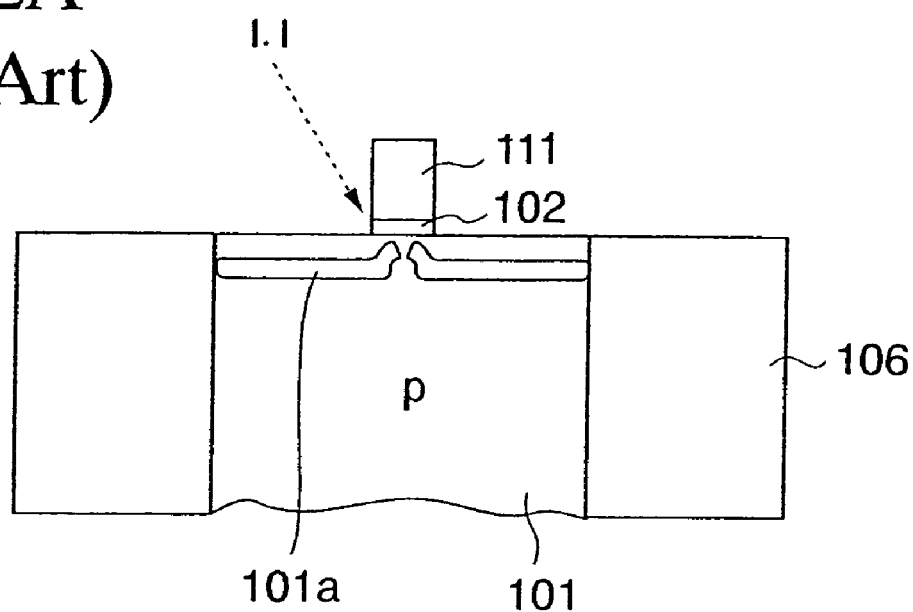
FIGS. 2A and 2B are sectional views showing the ion-implanting state for the pocket formation by using the normal gate electrode as a mask.
Figure 2B:
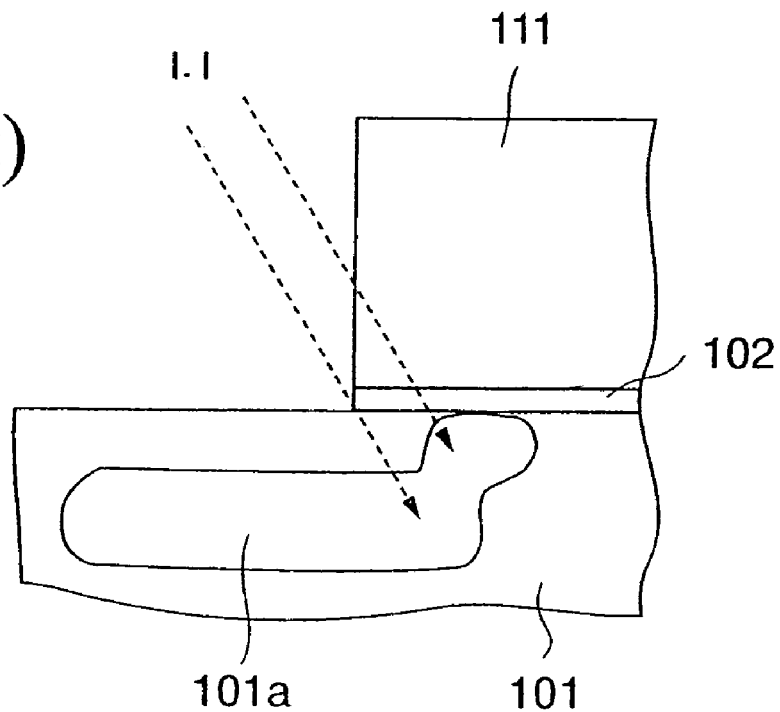
Figure 3:
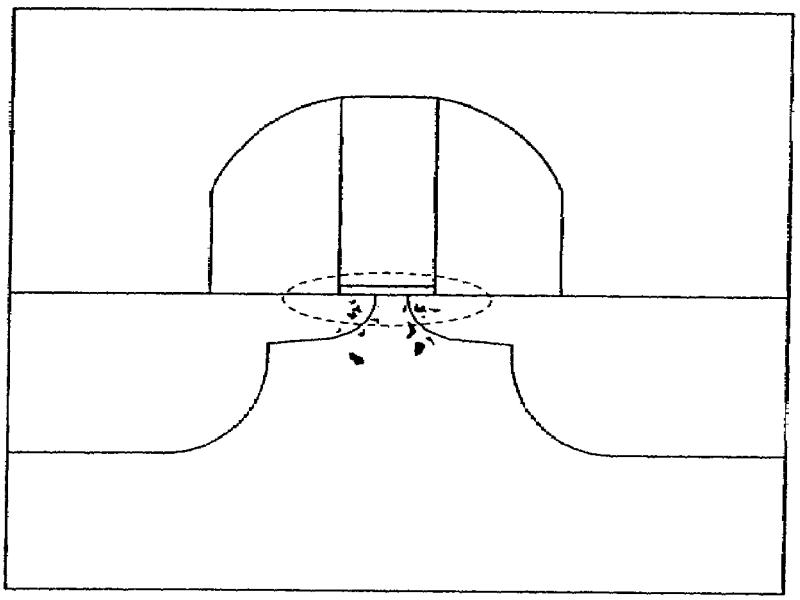
FIG. 3 is a view showing the impurity concentration distribution in the MOS transistor when the ion implantation shown in FIGS. 2A and 2B is employed.
Figure 14A:
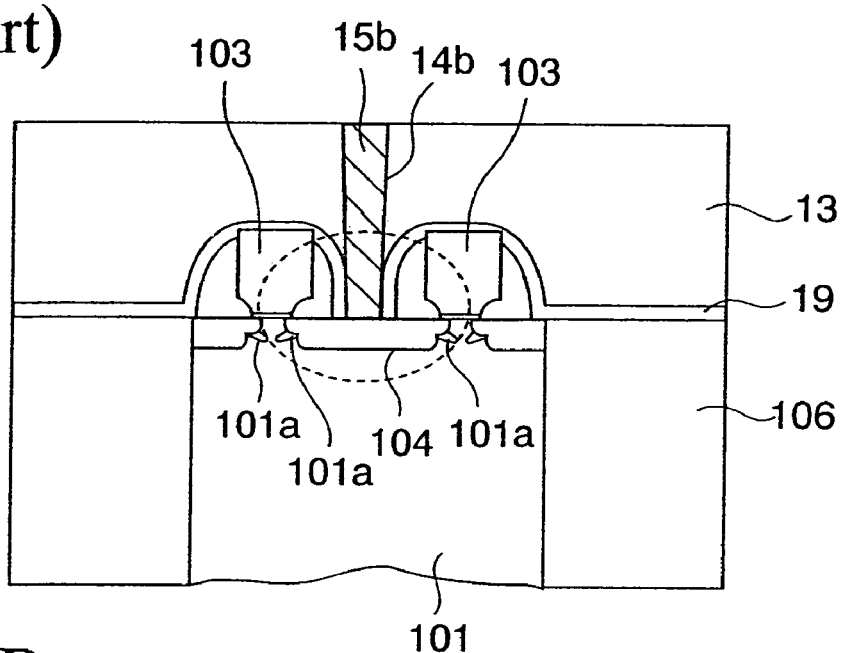
FIG. 14A is a sectional view showing a semiconductor device in the prior art.
Figure 14B:
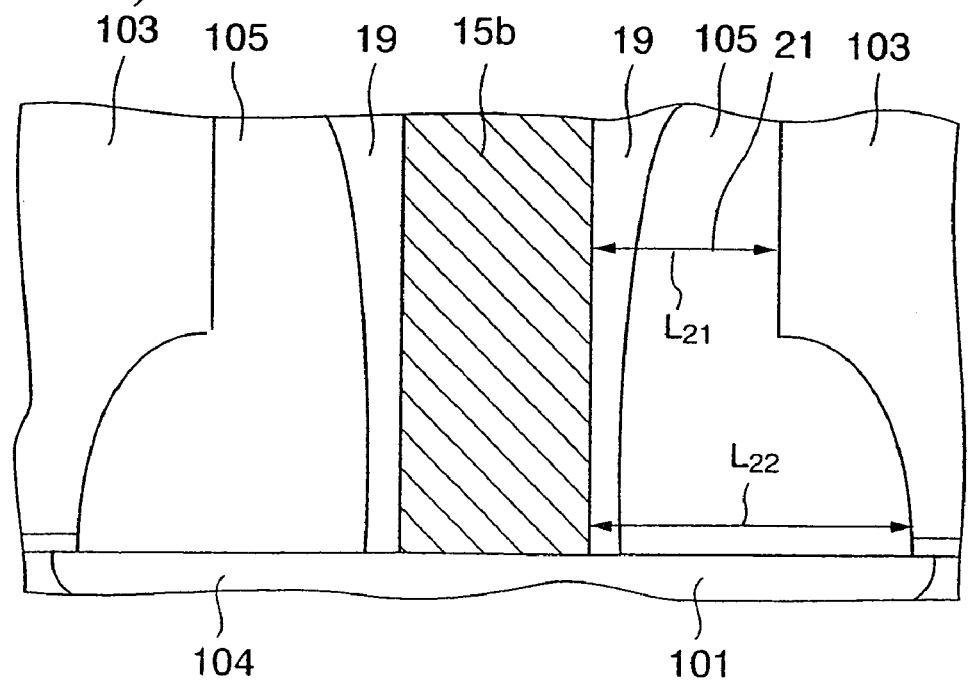
FIG. 14B is a fragmental enlarged sectional view of FIG. 14A.

In contrast, if the notch-type gate electrode 103 shown in FIG. 1A is employed, the active region of the memory cell has a structure shown in FIG. 14A. In this case, the width of the upper portion of the notch-type gate electrode 103 is wider than the width of the lower portion. Accordingly, as shown in an enlarged sectional view of FIG. 14B, in the notch-type gate electrode 103 in the prior art, distances $L_{21}$, $L_{22}$ between the upper portion and the lower portion and the bit-line contact hole 14c are different.

The distance between the gate electrode 5 or 103 and the contact hole 14c is decided by the breakdown voltage between the gate electrode 5 or 103 and the contact hole 14c. That is, the distance between the gate electrode 5 or 103 and the contact hole 14c is decided by the desired breakdown voltage value. The difference in the distance between the gate electrode 5 or 103 and the contact hole 14c is compared mutually in the notch-type gate electrode 103 and the gate electrode 5 having the notched structure in the first embodiment.

If the width (gate length) of the bottom portion of the notch-type gate electrode 103 in the prior art is set equal to the width (gate length) of the bottom portion of the gate electrode 5 in the first embodiment, the width of the upper portion of the notch-type gate electrode 103 in the prior art is larger than the width of the upper portion of the gate electrode 5 in the first embodiment. Therefore, the distance between the lower portion of the gate electrode 103 and the contact hole 14c in the prior art becomes larger than the distance between the lower portion of the gate electrode 5 and the contact hole 14c in the first embodiment. As for such gate electrode in the prior art, the substantially same structure is employed in Patent Application Publication (KOKAI) 2001-267562.

As a result, in the first embodiment, the distance $L_{11}$ between the gate electrode 5 and the contact hole 14c can be reduced rather than the prior art by the distance such as the depth D of the notch portion 8a or 103a.

Then, when the gate electrode in the prior art and the gate electrode in the first embodiment are actually formed, the variation in the lateral depth of the notch portion 103a is caused by 30% in the conventional notch forming method, and also there is such a tendency that the depth of the notch portion is not bilaterally symmetrical in the dense pattern region. In contrast, the variation in the lateral depth D of the notch portion 8a formed by the process in the first embodiment can be reduced into 15% rather than the prior art, and also the depth D of the notch portion 8a is bilaterally symmetrical.

(Second Embodiment)

In the first embodiment, as shown in FIG. 8H, after the notch portion 8a is formed under the ion-implantation controlling film 8 that is formed on the side surfaces of the gate electrode 5, the impurity ion is implanted into the silicon substrate 1 along the oblique direction via the notch portion 8a.

If the ion-implantation angle to the normal line of the substrate surface is increased, in some cases it is requested that the depth D of the notch portion 8a shown in FIG. 9 should be set larger than the height H.

The depth D of the notch portion 8a is given by a sum of a thickness of the silicon oxide film 6 and a thickness of the silicon nitride film 7 on the side surface of the gate electrode 5. Also, the height H of the notch portion 8a is given by the thickness of the silicon oxide film 6 on the upper surface of the silicon substrate 1 other than the notch portion 8a.

Here, if the silicon oxide film 6 is formed thick to increase the depth D of the notch portion 8a, the height H of the notch portion 8a is also increased simultaneously.

On the contrary, in order to increase the depth D of the notch portion 8a while suppressing the height H, the silicon nitride film 7 can be formed thick but and form the silicon oxide film 6 can be formed thin.

However, if the silicon nitride film 7 is formed thick, the silicon nitride film 7, which is left selectively on the sides of the gate electrode 5 by the unisotropic etching, becomes deep in the lateral direction, and thus the etchant is difficult to enter into the area under the silicon nitride film 7. As a result, it is possible that the formation of the notch portion 8a is delayed, or the surface of the silicon substrate 1 is exposed to the etchant for a longer time and becomes rough.

Therefore, steps of capable of forming the notch portion 8a low and deep and also reducing a time required to form the notch portion 8a will be explained hereinafter.

FIGS. 15A to 15I are sectional views showing steps of forming a semiconductor device according to a second embodiment of the present invention. In this case, in FIG. 15A to FIG. 15I, the same references as those in FIG. 8A to FIG. 8M denote the same elements.

Figure 15A:
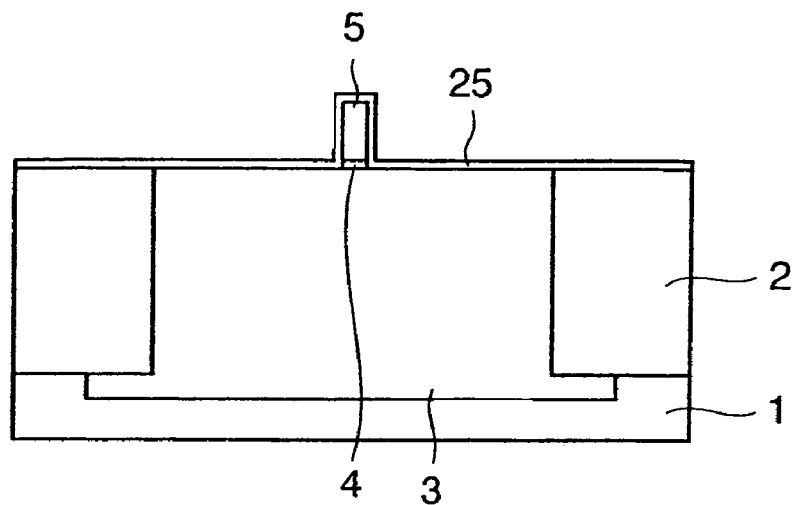
FIGS. 15A to 15I are sectional views showing steps of manufacturing a semiconductor device according to a second embodiment of the present invention.

Steps required until a structure shown in FIG. 15A is formed will be explained hereunder.

First, the gate electrode 5 is formed on the well region 3 of the silicon substrate 1 via the gate insulating film 4 by the same steps as the first embodiment.

Then, a first silicon oxide film 25 is formed on the surface of the gate electrode 5 and the surface of the silicon substrate 1. The first silicon oxide film 25 is formed by the low-pressure CVD method using the TEOS gas, for example, to have a thickness of 10 nm. The thickness is almost equal on the side surface of the gate electrode 5 and the upper surface of the silicon substrate 1.

Figure 15B:
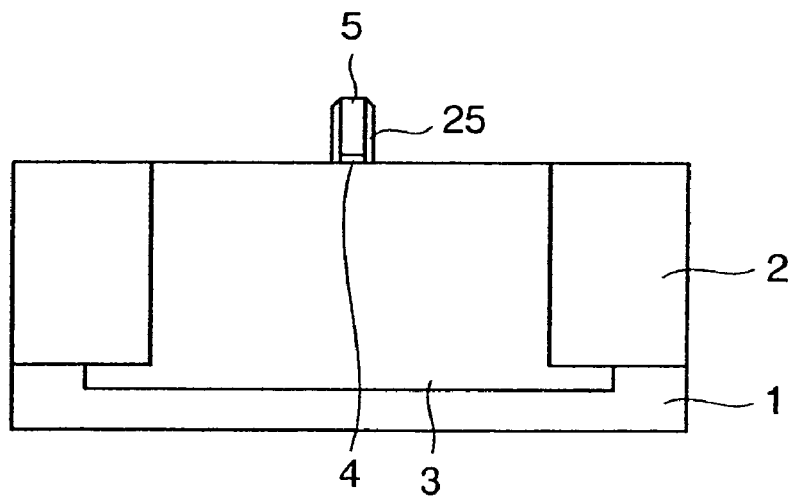

Then, as shown in FIG. 15B, the first silicon oxide film 25 is unisotropically etched in the almost vertical direction to the substrate surface by the reactive ion etching (RIE) method, and thus the first silicon oxide film 25 is left selectively an the side surfaces of the gate electrode 5.

Figure 15C:
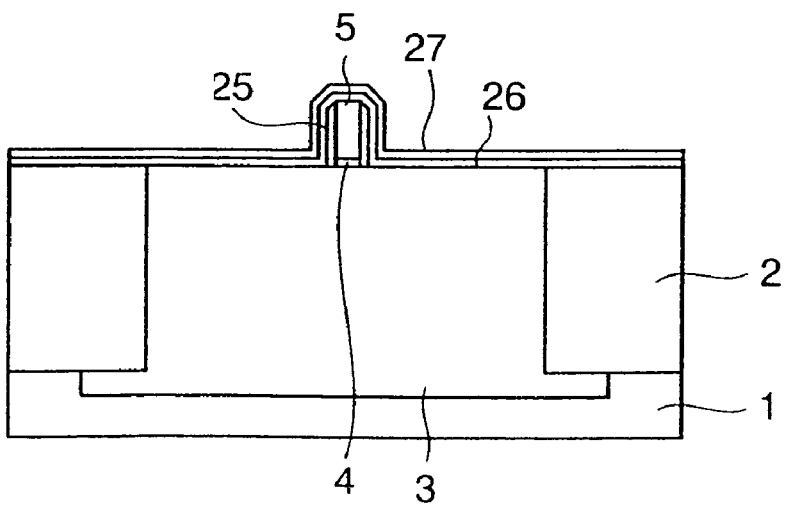

Then, as shown in FIG. 15C, a second silicon oxide film 26 is formed on the first silicon oxide film 25, the gate electrode 5, and the silicon substrate 1. The second silicon oxide film 26 is formed by the low-pressure CVD method using the TEOS gas, for example, to have a thickness of 15 nm. In this state, a total thickness of the silicon oxide films 25, 26 is 25 nm on the side surfaces of the gate electrode 5, while a total thickness of the second silicon oxide film 26 is 25 nm on the upper surface of the gate electrode 5.

Then, a silicon nitride film 27 is formed on the second silicon oxide film 26 by the plasma CVD method. This silicon nitride film 27 is formed almost uniformly to have a thickness of 5 nm.

Figure 15D:
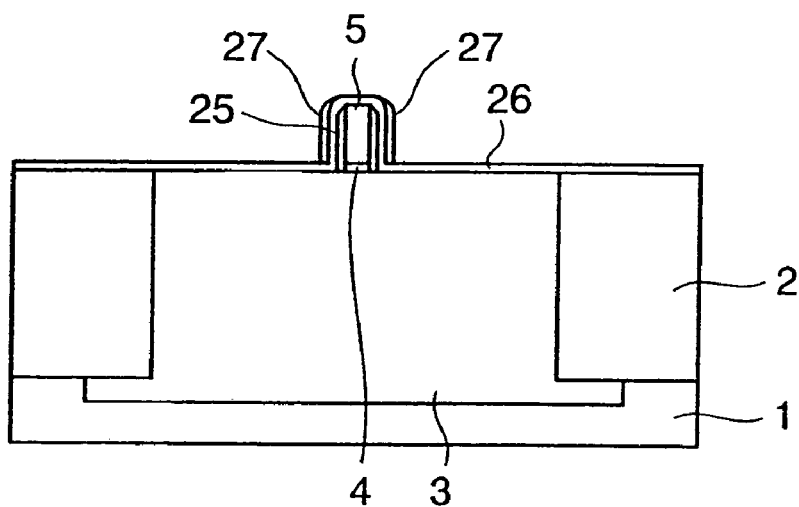

Then, as shown in FIG. 15D, the silicon nitride film 27 is unisotropically etched in the almost vertical direction by the RIE method. Thus, the silicon nitride film 27 is left selectively only on the sides of the gate electrode 5 and also the second silicon oxide film 26 formed on the upper surface of the gate electrode 5 and the upper surface of the silicon substrate 1 respectively is exposed.

Figure 15E:
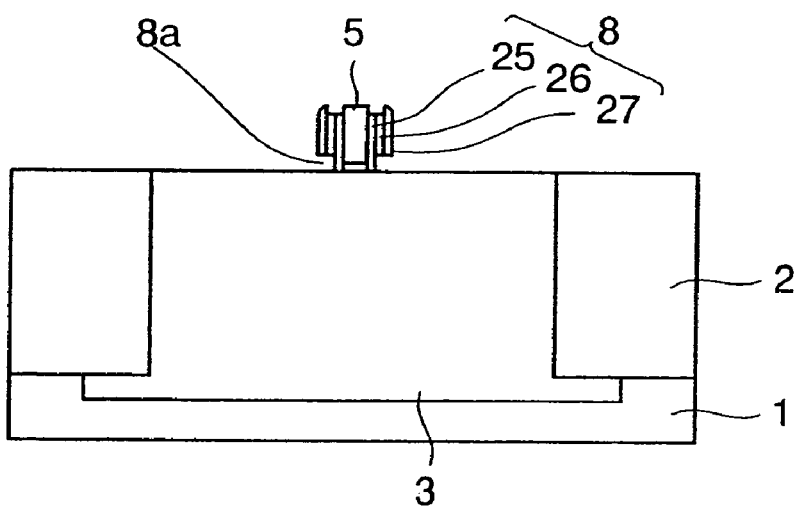

Then, as shown in FIG. 15E, when the first and second silicon oxide films 25, 26 are etched by using the chemical such as 0.5% HF, or the like, the second silicon oxide film 26 in the region that is not covered with the silicon nitride film 27 is isotropically etched. In this case, under the silicon nitride film 27 on the sides of the gate electrode 5, the second silicon oxide film 26 is etched by the chemical and then the first silicon oxide film 25 is etched. Thus, the notch portion 8*a* is formed under the silicon nitride film 27 separated from the silicon substrate 1 on both sides of the gate electrode 5. Also, the second silicon oxide film 26 on the upper surface of the gate electrode 5 is removed by the chemical to expose the upper surface of the gate electrode 5. The supply of the chemical to the silicon substrate 1 is stopped at the stage that the notch portion 8*a* is formed.

Accordingly, the first and second silicon oxide films 25, 26 and the silicon nitride film 27 are left as the ion-implantation controlling film 8 on both side surfaces of the gate electrode 5, and the notch portion 8*a* is present between the ion-implantation controlling film 8 and the silicon substrate 1. A height H of the notch portion 8*a* is about 15 nm that corresponds to a thickness of the second silicon oxide film 26, while a depth D of the notch portion 8*a* is about 30 nm that corresponds to a total thickness of the first and second silicon oxide films 25, 26 and the silicon nitride film 27 on the side surfaces of the gate electrode 5. As a result, an angle of a plane, which connects an edge portion of the bottom surface of the gate electrode 5 and an edge portion of the lower surface of the ion-implantation controlling film 8, to the normal line of the upper surface of the silicon substrate 1 is about 60 degree.

The unisotropic etching of the first and second silicon oxide films 25, 26 may be executed by the dry etching. However, if the wet etching by the chemical is employed, the etching is not affected by the density difference of the gate electrodes and the in-plane distribution on the substrate.

In this case, as explained in the first embodiment, the etching of the first silicon oxide film 25 may be stopped in the situation that the first silicon oxide film 25 is slightly left on the side surfaces of the gate electrode 5 below the silicon nitride film 27 that is left on the sides of the gate electrode 5.

Also, even if a distance between the second silicon oxide film 26 and the upper surface of the silicon substrate 1 becomes larger than a distance between the first silicon oxide film 25 and the upper surface of the silicon substrate 1 because the second silicon oxide film 26 is etched excessively in the notch portion 8*a*, the problem is not particularly caused.

Then, the impurity is ion-implanted to form extension regions 10*a* serving as the source/drain in the silicon substrate 1, and also the impurity is ion-implanted to form the pocket-pocket region 9 in the silicon substrate 1.

Figure 15F:
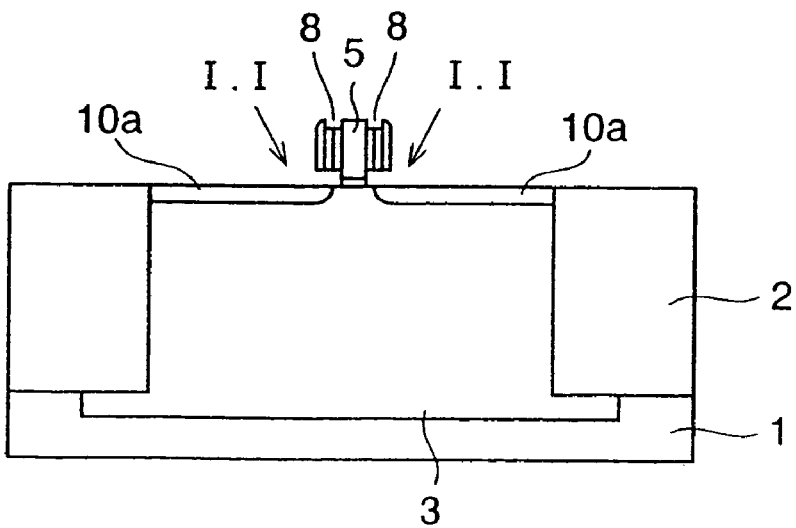
Figure 15G:
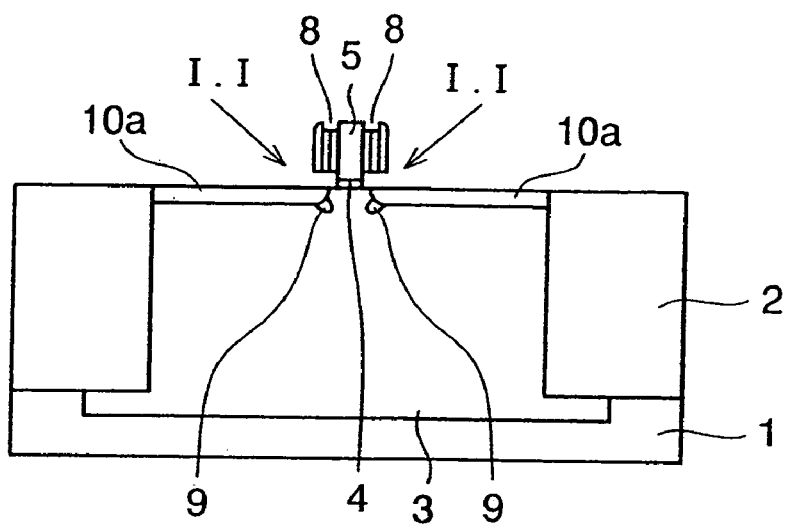

First, as shown in FIG. 15F and FIG. 15G, the extension regions 10*a* are formed by ion-implanting the impurity into the silicon substrate 1 while using the gate electrode 5 and the ion-implantation controlling film 8 as a mask.

In the above example, an angle of a plane, which connects the edge portion of the bottom surface of the gate electrode 5 and an extension of the edge portion of the lower surface of the ion-implantation controlling film 8, to the normal line of the upper surface of the silicon substrate 1 is set to 60 degree. Thus, if only an angle of the ion implantation is changed not to change the depth D of the notch portion 8*a*, the impurity can be ion-implanted into the silicon substrate 1 with a margin not to implant the impurity into the gate electrode 5.

The impurity having the same conductivity as that of the polysilicon film constituting the gate electrode 5 is introduced into the extension regions 10*a*. Here, in the case that the well 3 is p-type and the extension regions 10*a* are formed as the n-type and in the case that the well 3 is n-type and the extension regions 10*a* are formed as the p-type, the ion-implantation angles are different respectively. This is because the diffusion distances to activate the p-type impurity and the n-type impurity, which are ion-implanted into the silicon substrate 1, are different. In addition, the distance of the extension regions 10*a* must be controlled freely from the area being located just under the gate electrode 5.

For example, if the p-type extension regions 10*a* are formed, the boron ion is implanted into the n-type well 3 at an angle of 0 to 7 degree to the normal line of the upper surface of the silicon substrate 1, the acceleration energy of 2 keV, and the dosage of $1\times10^{15}/cm^2$. Then, in order to form the pocket region 9, the arsenic ion is implanted into the n-type well 3 at an angle of 10 to 30 degree to the normal line, the acceleration energy of 50 keV, and the dosage of $1\times10^{13}/cm^2$.

Also, if the n-type extension regions 10*a* are formed, the arsenic ion is implanted into the p-type well 3 at an angle of 10 to 20 degree to the normal line, the acceleration energy of 10 keV, and the dosage of $2.5\times10^{14}/cm^2$. Then, in order to form the pocket region 9, the boron ion is implanted into the p-type well 3 at an angle of 10 to 30 degree to the normal line, the acceleration energy of 10 keV, and the dosage of $1\times10^{13}/cm^2$.

In order to maintain the symmetry of the impurity concentration distribution in the extension regions 10*a* and the pocket region 9 on both sides of the gate electrode 5, these impurity ion implantations are executed four times in the four directions. An angle of the ion implantation in the planar direction can be selected arbitrarily.

The angle of the ion implantation (I.I) from the oblique direction to the normal line depends on the total width of the first and second silicon oxide films 25, 26 and the silicon nitride film 27 on the sides of the gate electrode 5, the spaces between the gate electrode 5 and other neighboring gate electrodes, the height of the gate electrode 5, etc. For example, if the total width of the first and second silicon oxide films 25, 26 and the silicon nitride film 27 is 0.05 μm, the space width between the gate electrode 5 and another neighboring gate electrode is 0.4 μm, the height of the gate electrode 5 is 0.1 μm, the impurity ion implantation angle, i.e., the angle to the normal line of the upper surface of the silicon substrate 1 must be set smaller than 70 degree.

Figure 15H:
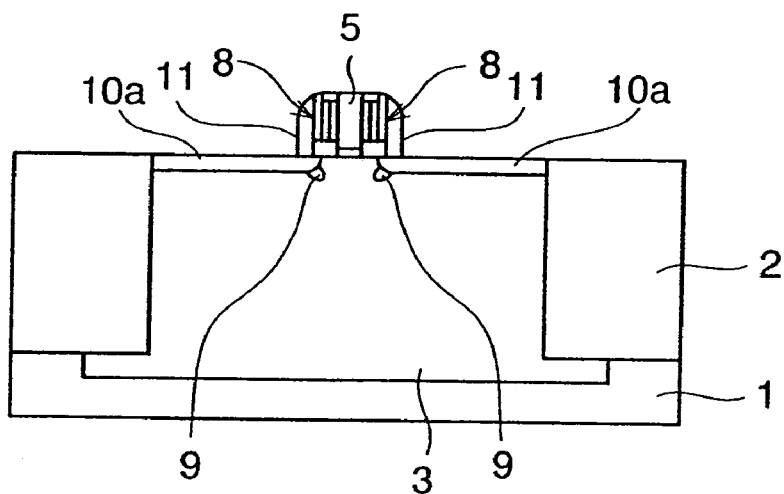

Then, as shown in FIG. 15H, according to the same method as that in the first embodiment, insulating sidewall spacers 11 for covering the ion-implantation controlling film 8 are formed on both sides of the gate electrode 5.

Figure 15I:
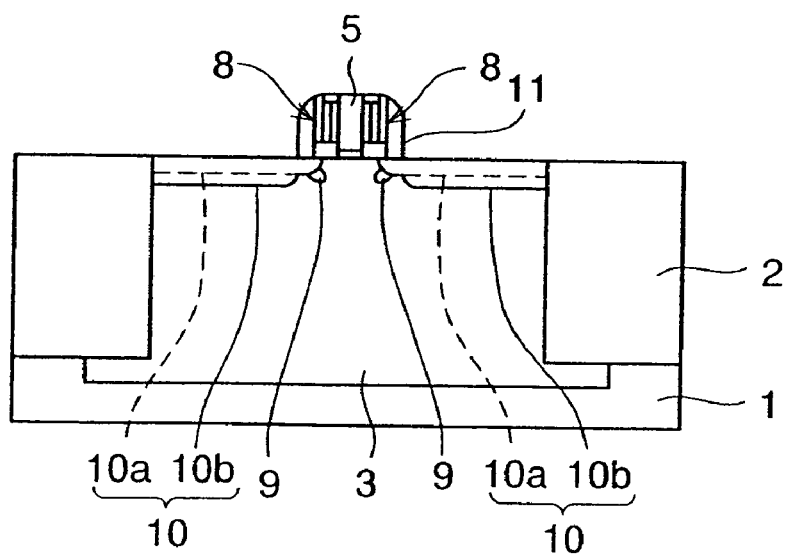

Then, as shown in FIG. 15I, according to the same method and conditions as those in the first embodiment, high-concentration impurity regions 10b that overlap partially with the extension regions 10a are formed by ion-implanting the impurity with the opposite conductivity to the well 3 into the well 3 while using the insulating sidewall spacers 11 and the gate electrode 5 as a mask. Thus, impurity diffusion regions 10 serving as the source/drain regions are formed, and then the annealing is carried out to activate the impurity.

According to the above embodiment, the notch portion 8a having the depth, which corresponds to the total thickness of the first and second silicon oxide films 25, 26 and the silicon nitride film 27, and the height, which corresponds to the thickness of the second silicon oxide film 26, is formed on both sides of the gate electrode 5. Therefore, the range in which the optimum value of the ion implantation angle can be selected in the impurity ion implantation in the oblique direction can be extended. As a result, the implantation of the impurity into the gate electrode 5 can be avoided without fail during the ion implantation into the silicon substrate 1.

Such notch portion 8a is formed by forming the silicon oxide film only on the side surfaces of the gate electrode 5, then forming sequentially the silicon oxide film and the silicon nitride film, then applying the unisotropic etching to the silicon nitride film in the vertical direction, and then applying the isotropic etching under the conditions that the double-layered silicon oxide film can be etched selectively. Therefore, the depth D of the notch portion 8a can be deepened not to increase the film thickness of the silicon nitride film that is formed on the silicon oxide film. As a result, the etching of the first and second silicon oxide films 25, 26 under the silicon nitride film 27, which acts as the etching mask during the formation of the notch portion 8a, can be facilitated.

(Third Embodiment)

Next, a method of forming another notch portion according to a third embodiment of the present invention will be explained hereunder.

Figure 16A:
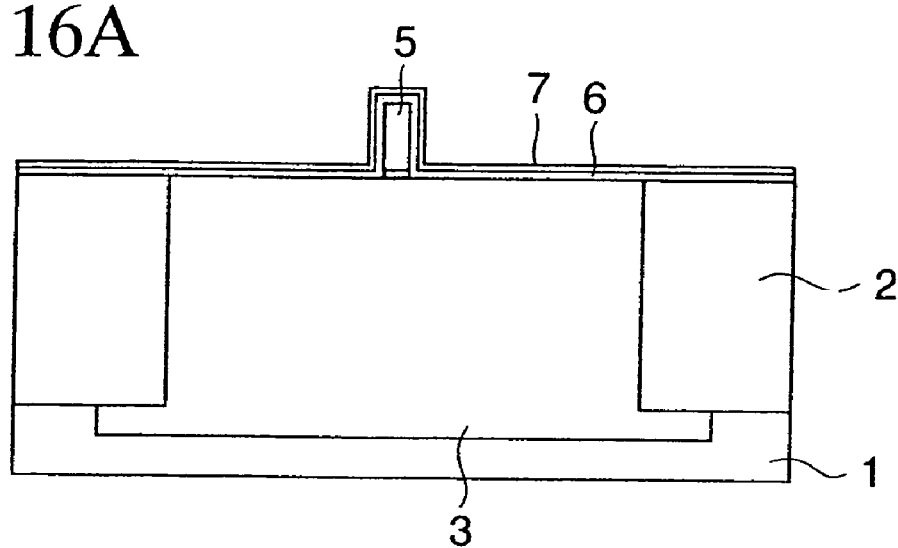
FIGS. 16A to 16C are sectional views showing steps of manufacturing a semiconductor device according to a second embodiment of the present invention.

First, according to the steps described in the first embodiment, the gate electrode 5 is formed on the silicon substrate 1. Then, as shown in FIG. 16A, the silicon oxide film 6 and the silicon nitride film 7 for covering the gate electrode 5 are formed in sequence on the silicon substrate 1. The growth conditions of these films 6, 7 are set identically to those in the first embodiment.

Figure 16B:
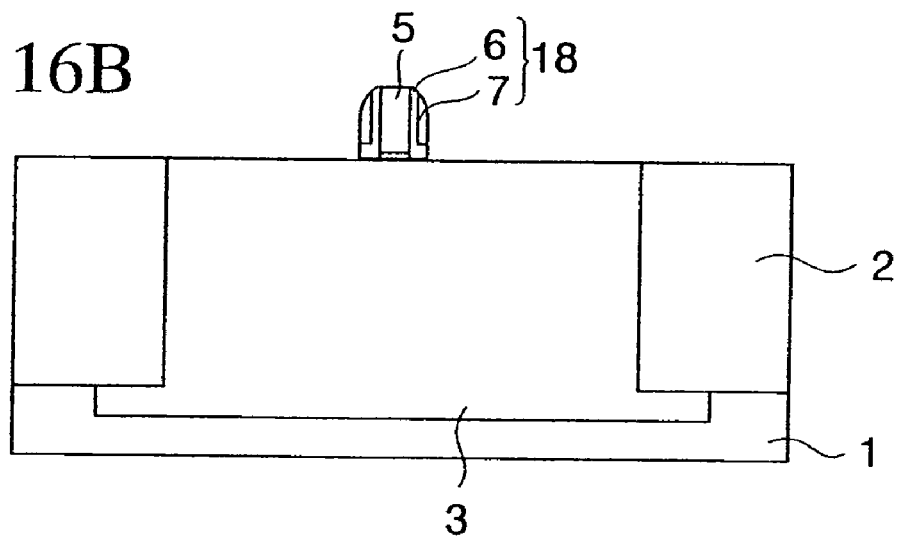

Then, as shown in FIG. 16B, the silicon oxide film 6 and the silicon nitride film 7 are unisotropically etched in the direction substantially perpendicular to the substrate surface to leave them on the side portions of the gate electrode 5 as the ion-implantation controlling film 8.

Figure 16C:
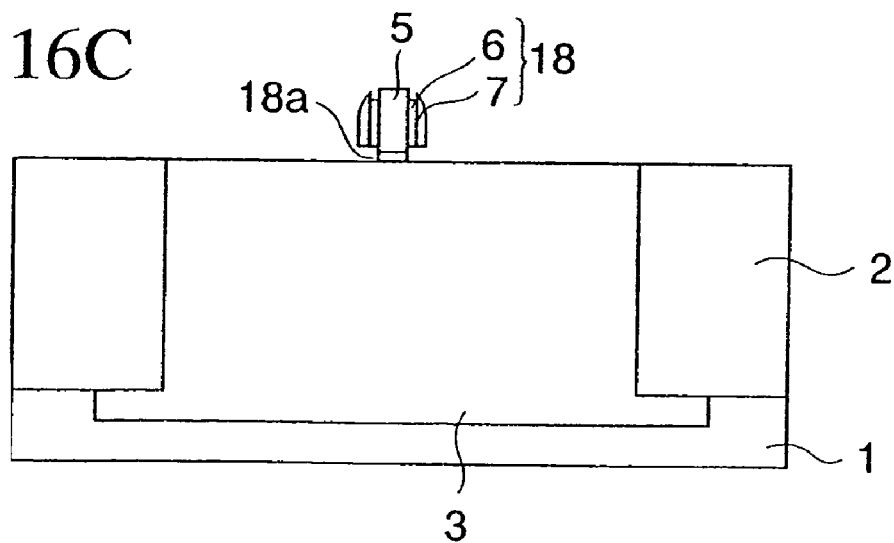

The silicon oxide film 6 is exposed from the lower end of the ion-implantation controlling film 8. Therefore, the silicon oxide film 6 is wet-etched by the chemicals of 0.5% HF while using the silicon nitride film 7 as a mask. Thus, as shown in FIG. 16C, a notch portion (space) 18a is formed between the silicon oxide film 6 and the silicon nitride film 7 on the side surfaces of the gate electrode 5 and the silicon substrate. As a result, a shape of an ion-implantation controlling film 18 in the second embodiment becomes similar to that of the ion-implantation controlling film 8 in the first embodiment.

Since the etching of the silicon oxide film 6 to form the notch portion 18a in the third embodiment is required only in the depth direction of the notch portion 18a, the etching efficiency is high rather than the first embodiment and thus the etching residue of the silicon oxide film 6 is difficult to occur.

As described above, the ion-implantation controlling film 18 having the notch portion 18a is formed and then the extension implantation and the pocket implantation are carried out under the same conditions as the first embodiment. In addition, since the subsequent steps are similar to the first embodiment, their explanation will be omitted.

(Fourth Embodiment)

With the miniaturization of the MOS transistor, it is required that the width of the gate electrode of the MOS transistor should be reduced smaller than 50 nm and the extension regions serving as the source/drain should be reduced thinner than about 30 nm.

Also, in the MOS transistor in which the pocket implantation technology is employed, the ion implantation for forming the extension regions, the ion implantation for forming the pocket region, and the ion implantation for forming the high-concentration impurity region are needed. In addition, if it is considered together that the p-type MOS transistor and the n-type MOS transistor are formed on the same silicon substrate 1, the impurity ion implantation step must be executed six times.

The n-type MOS transistor forming region is covered with the resist during the impurity ion implantation to form the p-type MOS transistor. Conversely, the p-type MOS transistor forming region is covered with the resist during the impurity ion implantation to form the n-type MOS transistor. Thus, the individual implantation of the impurity ion is executed.

Meanwhile, as also explained in the above embodiments, the dosage of the impurity ion implantation to form the extension regions is set higher than the dosage of the impurity ion implantation to form the pocket region. For example, the dosage of the impurity ion implantation to form the extension regions is set to $1\times10^{15}/cm^2$ to $2\times10^{15}/cm^2$. The dosage of the impurity ion implantation to form the pocket region is set smaller than such dosage by about two figures.

Therefore, in the impurity ion implantation to form the extension regions, the impurity is also implanted into the resist, which covers a partial area of the silicon substrate, with a high concentration. Thus, since the quality of the resist is altered and thus the peeling-off of the resist becomes difficult, normally two steps of the dry etching and the wet etching are taken to remove the resist from the silicon substrate.

According to such resist removing method, the surfaces of the extension regions exposed on both sides of the gate electrode are eroded by the chemical reaction and are dug up to a depth of about 10 nm. Thus, the extension regions become too thin and thus the conductance of the extension regions is reduced.

Therefore, a method of preventing the reduction in film thickness of the extension regions, which is caused in such peeling-off of the resist, will be explained hereunder.

FIGS. 17A to 17J are sectional views showing semiconductor device manufacturing steps according to a fourth embodiment of the present invention.

Figure 17A:
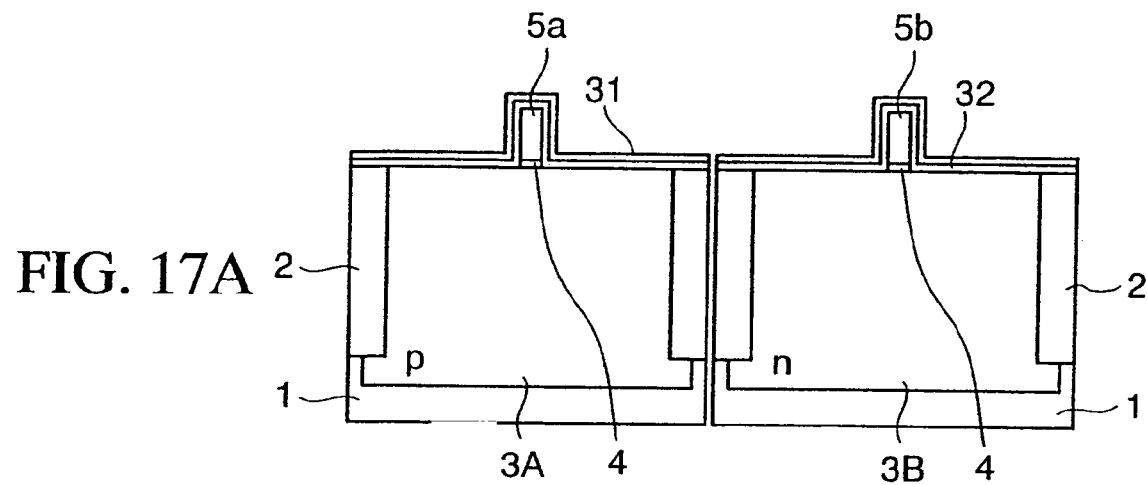
FIGS. 17A to 17J are sectional views showing steps of manufacturing a semiconductor device according to a fourth embodiment of the present invention.

Steps required until a structure shown in FIG. 17A is formed will be explained hereunder.

First, the STI structure (element isolation structure) 2 is formed on the n-type or p-type silicon substrate 1 to surround the active region. Then, a p-well 3A is formed in the silicon substrate 1 by ion-implanting the p-type impurity, e.g., the boron, into the active region in which the n-type MOS transistor is to be formed. Then, an n-well 3B is formed in the silicon substrate 1 by ion-implanting the n-type impurity, e.g., the arsenic, into the active region in which the p-type MOS transistor is to be formed. The formation of the p-well 3A and the n-well 3B is the well-known technology, and such well may be formed by any one of the well-known technologies. In this case, the p-type MOS transistor forming region is covered with the resist (not shown) when the p-well 3A is formed, while the n-type MOS transistor forming region is covered with another resist (not shown) when the n-well 3B is formed.

Then, the gate insulating film 4 made of the high-temperature oxide film shown in the first embodiment is formed on the surface of the silicon substrate 1 to have a thickness of 1 to 2 nm. Then, a polysilicon film of 150 nm thickness, for example, is formed on the gate insulating film 4 by the CVD method, and then the polysilicon film is patterned by the photolithography method. Thus, a gate electrode 5a is formed on the p-well 3A and simultaneously a gate electrode 5b is formed on the n-well 3B. The phosphorus, for example, as the n-type impurity is introduced into the polysilicon film constituting the gate electrode 5a on the p-well 3A. Also, the boron, for example, is introduced into the polysilicon film constituting the gate electrode 5b on the p-well 3A as the p-type impurity. In the introduction of the impurity into the polysilicon film, the n type or the p type is selected before the patterning of the polysilicon film.

Then, a silicon oxide ($SiO_2$) film 31 of 15 nm thickness is formed on the gate electrodes 5a, 5b and the silicon substrate 1 by the low-pressure plasma CVD method using TEOS as the source gas, for example. This $SiO_2$ film 31 is formed thicker than a film thickness of the gate insulating film 4 on the silicon substrate 1.

Then, a silicon nitride ($Si_3N_4$) film 32 of 5 nm thickness, for example, is formed on the silicon oxide film 31 by the CVD method using silane ($SiH_4$) and ammonia ($NH_3$). If this silicon nitride film 32 is used as the overlying insulating film and the silicon oxide film 31 is used as the underlying insulating film, the overlying insulating film and the underlying insulating film are formed of the materials that make it possible to execute the selective etching of the underlying insulating film to the overlying insulating film.

Figure 17B:
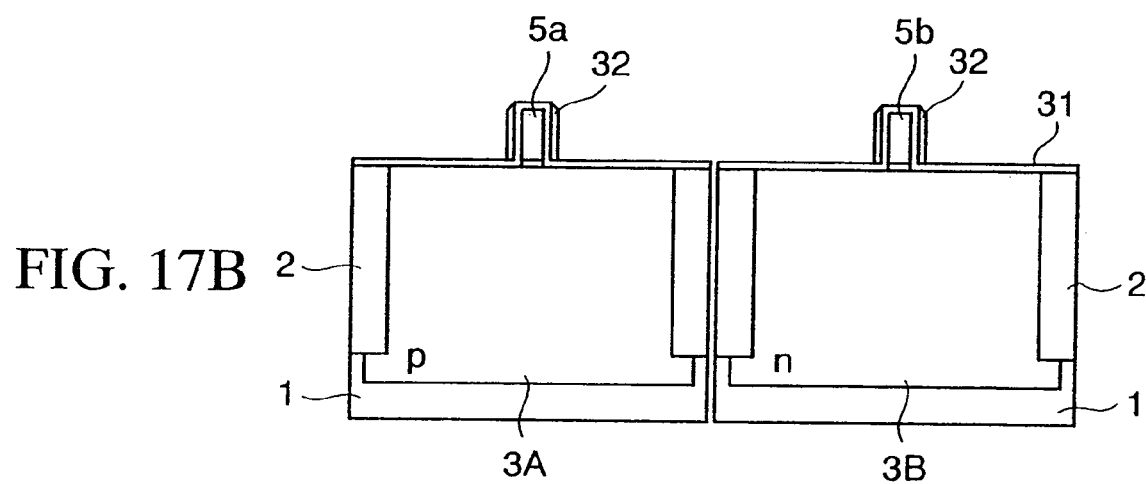

Then, as shown in FIG. 17B, the silicon nitride film 32 is left selectively on sides of the gate electrodes 5a, 5b by applying the unisotropic etching to the upper surface of the silicon substrate 1 in the almost vertical direction.

Figure 17C:
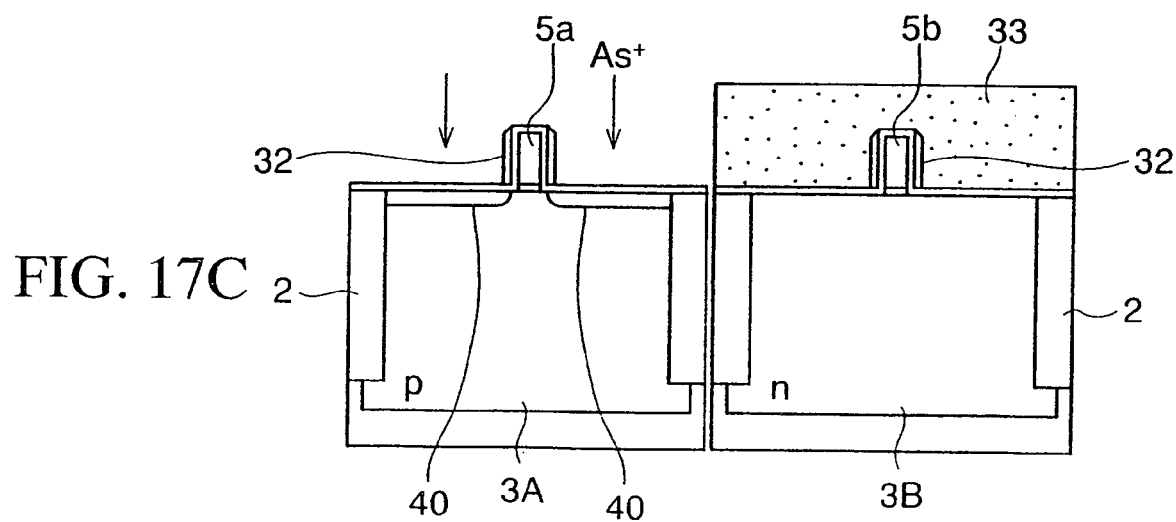

Then, as shown in FIG. 17C, the n-well 3B on the silicon substrate 1 is covered selectively with a resist 33. Then, the n-type impurity is implanted into the p-type well 3A via the silicon oxide film 31 formed on the surface of the silicon substrate 1 while using the gate electrode 5a, the silicon nitride films 32 on both sides of the gate electrode 5a, and the silicon oxide film 31 as a mask, and thus n-type extension regions 40 are formed up to a depth of 30 nm. As the ion implantation to form the n-type extension regions 40, the arsenic ion ($As^+$), for example, is implanted at the acceleration energy of 4 keV, the dosage of $1 \times 10^{15}/cm^2$, and the tilt angle of 0.

Figure 17D:
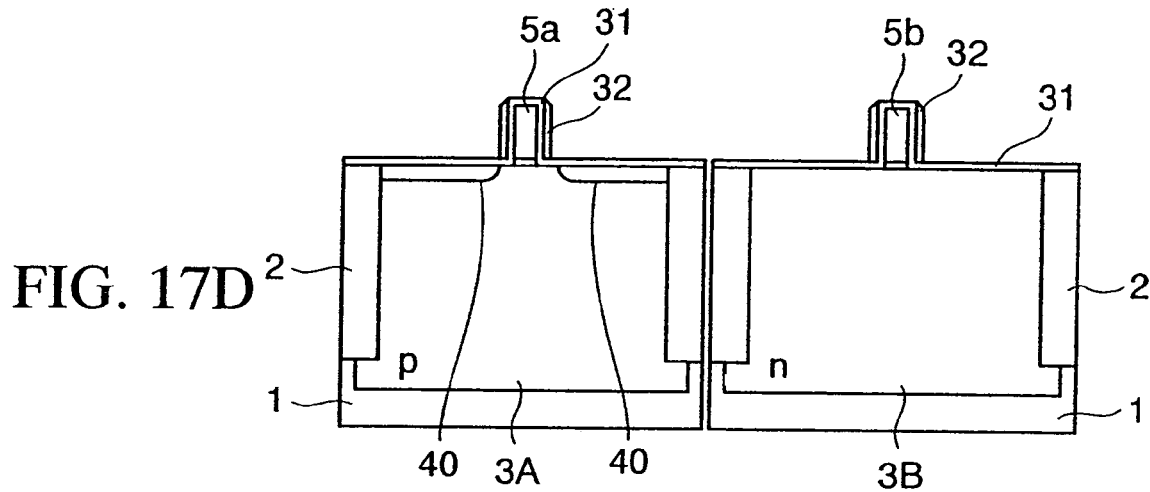

Then, as shown in FIG. 17D, the oxygen ashing is applied to the resist 33, and then residual of the resist 33 is removed by the wet etching. In this case, since the p-type well 3A is covered with the silicon oxide film 31 to protect, surfaces of the n-type extension regions 40 in the p-type well 3A are never exposed to the oxygen ashing process and the wet etching process and are not dug by the chemical reaction.

Figure 17E:
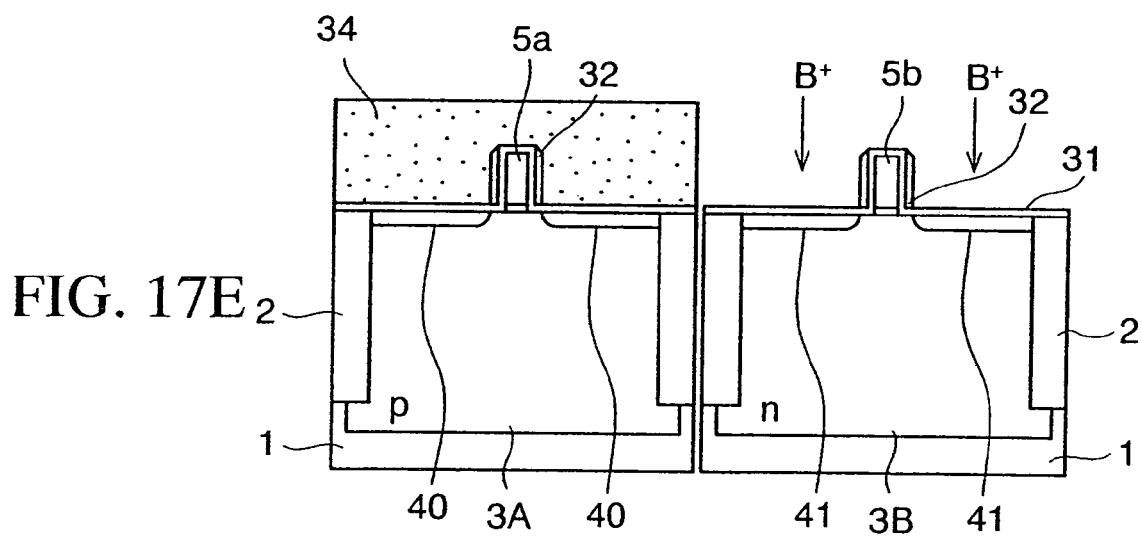

Then, as shown in FIG. 17E, the p-type well 3A of the silicon substrate 1 is covered selectively with a resist 34. Then, the p-type impurity is implanted into the n-type well 3B via the silicon oxide film 31 formed on the surface of the silicon substrate 1 while using the gate electrode 5b, the silicon nitride films 32, and the silicon oxide film 31 as a mask, and thus p-type extension regions 41 are formed up to a depth of about 30 nm. As the ion implantation to form the p-type extension regions 41, the boron ion ($B^+$), for example, is implanted at the acceleration energy of 0.5 keV, the dosage of $1 \times 10^{15}/cm^2$, and the tilt angle of 0.

Figure 17F:
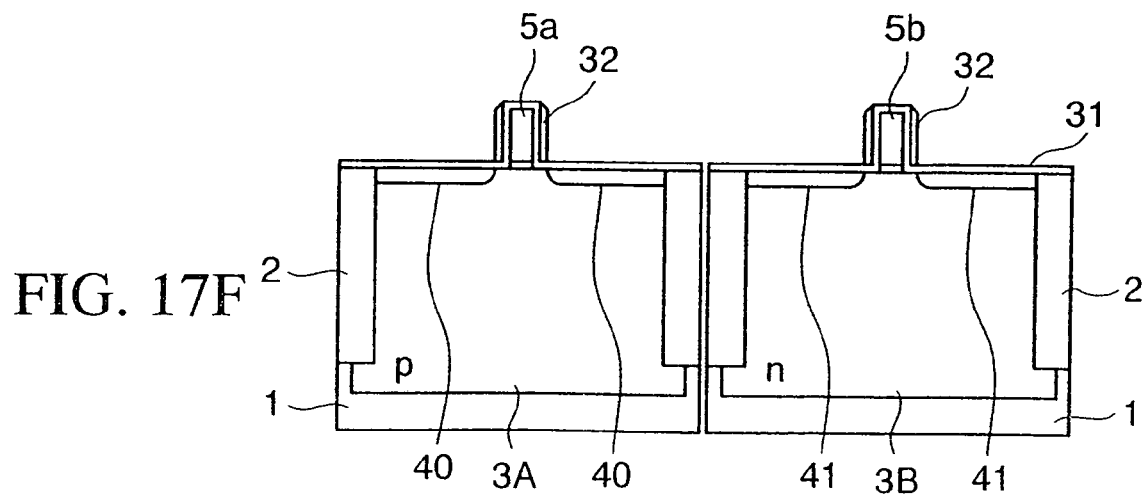

Then, as shown in FIG. 17F, the oxygen ashing is applied to the resist 34, and then residual of the resist 34 is removed by the wet etching. In this case, since the n-type well 3B is covered with the silicon oxide film 31 to protect, surfaces of the p-type extension regions 41 in the n-type well 3B are not dug by the chemical reaction.

Figure 17G:
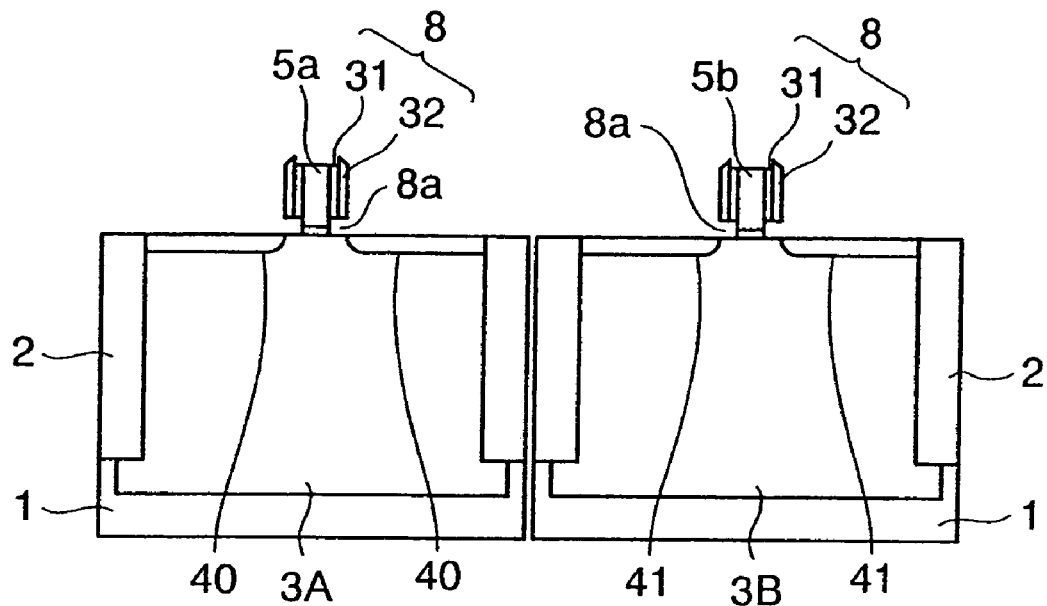

Then, as shown in FIG. 17G, the isotropic etching is applied to the silicon oxide film 31 by using the chemical such as 0.5% HF (hydrofluoric acid), or the like. In this case, the silicon oxide film 31 is left selectively on the sides of the gate electrodes 5a, 5b by using the silicon nitride films 32 on the sides of the gate electrodes 5a, 5b as a mask. In this case, the etching conditions are set to form spaces, which has a height larger than the thickness of the gate insulating film 4, between the silicon oxide film 31 and the silicon nitride films 32 on the sides of the gate electrodes 5a, 5b and the upper surface of the silicon substrate 1. In other words, the portions of the silicon oxide film 31, which are covered with the silicon nitride films 32, are not etched by the chemical, but upper and lower portions, which are not covered with the silicon nitride films 32, are isotropically etched. In this case, since such etching is the wet etching, this etching is not affected by the density difference of the gate electrodes 5a, 5b and the in-plane distribution.

Here, if the method of etching the silicon oxide film 31 under the condition that the high selective etching ratio to the gate electrodes 5a, 5b and the silicon nitride film 32 can be maintained is employed, the dry etching may be employed.

According to the above etchings, the upper surface of the silicon substrate 1, upper portions of the gate electrodes 5a, 5b, and lower side surfaces of the gate electrodes 5a, 5b are exposed.

After the silicon oxide film 31 is removed from the upper surface of the silicon substrate 1, the silicon nitride films 32 and the silicon oxide film 31 being left on the side surfaces of the gate electrodes 5a, 5b act as the ion-implantation controlling film 8, and also the spaces being formed under the ion-implantation controlling film 8 act as the notch portion 8a.

Figure 17H:
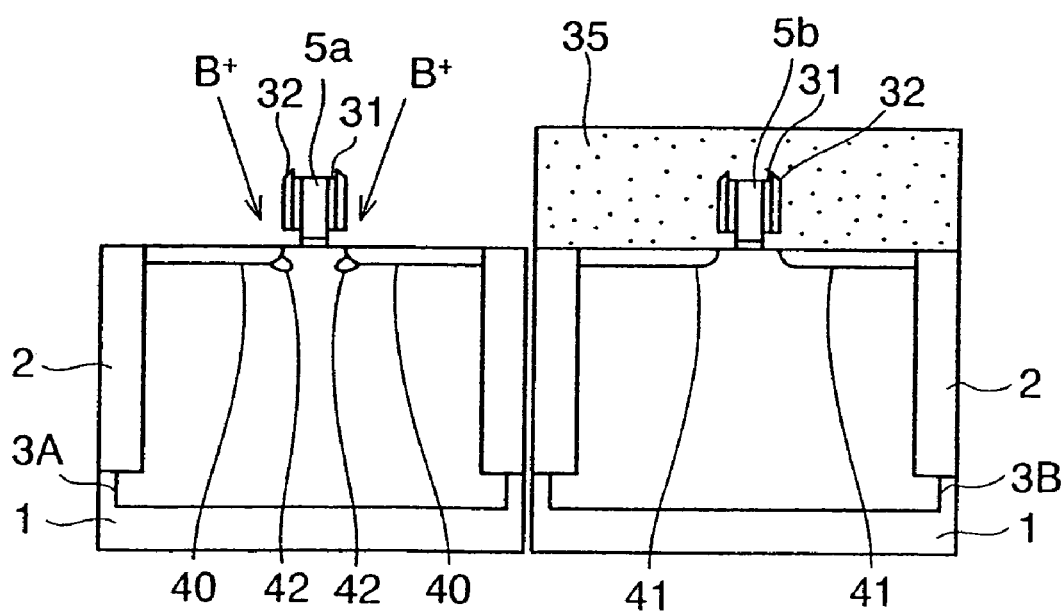

Then, as shown in FIG. 17H, the n-type well 3B is covered with a resist 35. Then, the impurity having the same conductivity as the p-type well 3A, e.g., the p-type impurity such as the boron, is ion-implanted into the upper surface of the silicon substrate 1 in the oblique direction. In this case, the gate electrode 5a and the ion-implantation controlling film 8 function as a mask of the notch structure.

The p-type impurity ion is implanted up to a predetermined depth from the surface of the p-type well 3A on both sides of the ion-implantation controlling film 8 and the gate electrode 5a and also implanted into the p-type well 3A via the notch portion 8a under the ion-implantation controlling film 8 up to a predetermined depth. As the implantation conditions of the boron ion ($B^+$), the acceleration energy of 10 keV, the dosage of $1 \times 10^{13}/cm^2$, and the tilt angle of about 20 are selected, and the ion-implantation is executed in four directions. This tilt angle is the angle from the normal direction to the surface of the silicon substrate 1.

As a result, like the first embodiment, in the p-type well 3A, p-type pocket regions 42 whose impurity concentration is higher than the surface layer between two n-type extension regions 40 are formed at a predetermined depth from the surface of the silicon substrate 1.

Then, the resist 35 on the n-type well 3B is removed by the oxygen ashing. In this case, since the dosage of the ion implantation to form the pocket regions 42 is also low, the alteration in quality of the resist 35 can be suppressed. Therefore, a time required for the oxygen ashing is shorter than the resist removal executed after the formation of the extension regions 40, 41. In addition, there is no need to remove the resist 35 by the chemical and thus the surface of the p-type well 3A is seldom dug.

Figure 17I:
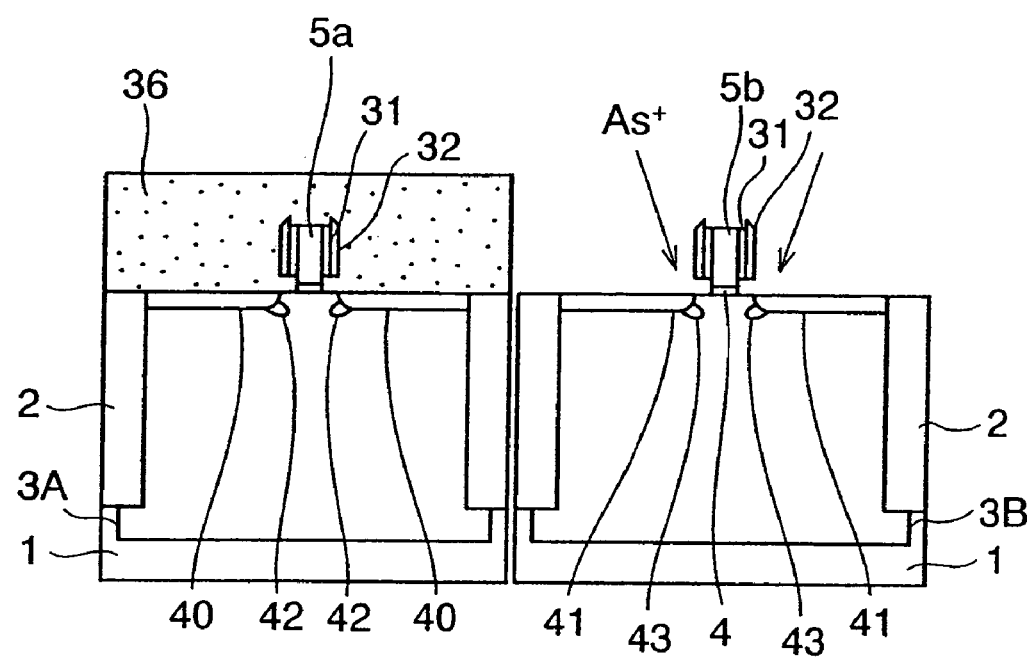

Then, as shown in FIG. 17I, the p-type well 3A is covered with a resist 36. Then, the impurity having the same conductivity as the n-type well 3B, e.g., the n-type impurity such as the arsenic, is ion-implanted into the upper surface of the silicon substrate 1 in the oblique direction. In this case, the gate electrode 5b and the ion-implantation controlling film 8 function as a mask of the notch structure.

The n-type impurity ion is ion-implanted up to a predetermined depth from the surface of the n-type well 3B on both sides of the ion-implantation controlling film 8 and the gate electrode 5b and also ion-implanted into the n-type well 3B via the notch portion 8a under the ion-implantation controlling film 8 up to a predetermined depth. As the implantation conditions of the arsenic ion ($As^+$), the acceleration energy of 50 keV, the dosage of $1 \times 10^{13}/cm^2$, and the tilt angle of about 20 are selected, and the ion-implantation is executed in four directions.

As a result, like the first embodiment, in the n-type well 3B, n-type pocket regions 43 whose impurity concentration is higher than the surface layer between two p-type extension regions 41 are formed at a predetermined depth from the surface of the silicon substrate 1.

Then, the resist 36 on the p-type well 3A is removed by the oxygen ashing. In this case, since the dosage of the ion implantation to form the pocket regions 43 is also low, the alteration in quality of the resist 36 can be suppressed. Therefore, a time required for the oxygen ashing is shorter than the resist removal executed after the formation of the extension regions 40, 41. In addition, there is no need to remove the resist 36 by the chemical and thus the surface of the n-type well 3B is hardly dug.

After these impurity ion implantations, the silicon substrate 1 is annealed at 950° C. for 10 sec, for example, to activate the impurity.

Figure 17J:
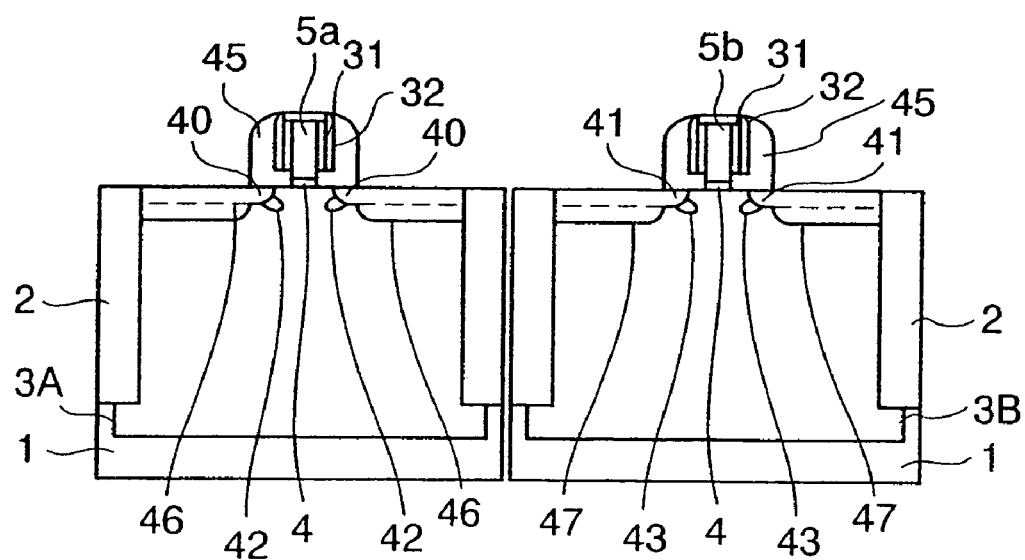

Next, steps required until a structure shown in FIG. 17J is formed will be explained hereunder.

First, a silicon oxide film for covering the gate electrodes 5a, 5b and the ion-implantation controlling film 8 is formed on the overall surface of the silicon substrate 1 to have a thickness of 100 nm. Insulating sidewall spacers 45 are left only on the side surfaces of the gate electrodes 5a, 5b respectively by etching the silicon oxide film in the almost vertical direction.

Then, while covering the n-type well 3B with the resist (not shown), the n-type impurity, e.g., the phosphorus ion ($P^+$) is implanted into the p-type well 3A under the condition of 20 keV and $5 \times 10^{15}/cm^2$ by using the gate electrode 5a and the sidewall spacers 45 on both sides of the gate electrode 5a as a mask. Thus, n-type high-concentration impurity regions 46 serving as the source/drain are formed.

Then, the resist is removed. Then, while covering the p-type well 3A with another resist (not shown), the p-type impurity, e.g., the boron ion ($B^{30}$) is implanted into the n-type well 3B under the condition of 5 keV and $5 \times 10^{15}/cm^2$ by using the gates electrode 5b and the sidewall spacers 45 on both sides of the gate electrode 5b as a mask. Thus, p-type high-concentration impurity regions 47 serving as the source/drain are formed.

Then, the silicon substrate 1 is annealed at 1000° C. for 5 sec, for example, to activate the impurity.

As a result, the n-type MOS transistor having the gate electrode 5a, the extension regions 40, the high-concentration impurity regions 46, and the pocket regions 42, which serve as the source/drain, is formed in the p-type well 3A of the silicon substrate 1. Also, the p-type MOS transistor having the gate electrode 5b, the extension regions 41, the high-concentration impurity regions 47, and the pocket regions 43, which serve as the source/drain, is formed in the n-type well 3B of the silicon substrate 1.

Then, like the first embodiment, an interlayer insulating film for covering the n-type MOS transistor and the p-type MOS transistor is formed, and then wirings are formed on the interlayer insulating film. But their details will be omitted herein.

As described above, in the present embodiment, after the extension regions 40, 41 are formed, the isotropic etching is applied to the silicon oxide film 31 by using the silicon nitride films 32 on the sides of the gate electrode 5 as a mask.

Therefore, in the case that the resist 33 formed on the silicon substrate 1 is to be removed to form the n-type extension regions 40 or in the case that the resist 34 formed on the silicon substrate 1 is to be removed to form the p-type extension regions 41, the silicon substrate 1 is protected by the silicon oxide film 31 from the dry atmosphere and the chemical during the removal of the resist and thus is never dug. As a consequence, since the extension regions 40, 41 can be formed up to the proper depth, the conductance of the MOS transistor can be maintained highly.

(Other Embodiment)

In the above embodiments, the example in which the gate electrode is formed of polysilicon and the silicon oxide film 6 and the silicon nitride film 7 are formed as the ion-implantation controlling film 8 is described, but they are not limited to these materials. In other words, respective materials may be selected such that the etching selective ratio to the gate electrode 5 becomes high when the film constituting the ion-implantation controlling film 8 is etched.

Also, as the material constituting the gate electrode 5, the conductive material such as the metal containing W, Mo, Ti, the compound such as TiN, etc. may be employed in place of polysilicon. In this case, the silicon oxide nitride (ON) film or the silicon carbide (SiC) film may be employed instead of the silicon nitride film 7 constituting the ion-implantation controlling film 8.

Further, in the above example, the ion-implantation controlling film 8 formed on the side surfaces of the gate electrode 5 is formed of the silicon oxide film 6 and the silicon nitride film 7. But the ion-implantation controlling film 8 may be formed of the material that can be selectively etched with respect to the gate electrode 5 and the silicon substrate 1, e.g., the metal film. If the ion-implantation controlling film 8 is formed of the metal material, the gate length of the gate electrode 5 has already been decided at the time of the formation and therefore the gate length of the gate electrode 5 is not changed. Rather, there is such an advantage that the electric resistance of the gate electrode 5 can be reduced. However, in the case of the structure shown in FIG. 12A, it is preferable that the ion-implantation controlling film 8 should be formed of the insulating material with regard to the breakdown voltage.

In this case, in Patent Application Publication (KOKAI) 2000-269500 and Patent Application Publication (KOKAI) Hei 9-213941, it is set forth to form the sidewalls having the multi-layered structure on the side surfaces of the gate electrode. However, since these sidewalls are not formed into the shape to expose the lower portion of the gate electrode, they cannot be employed as the mask for the ion implantation to form the pocket.

As described above, according to the present invention, the notch-containing structure in which the first and second insulating films, between which and the semiconductor substrate the spaces (notches) are form, are formed on the side surfaces of the gate electrode is employed. Therefore, if the impurity is ion-implanted into the semiconductor substrate in the oblique direction by using the notch-containing structure as a mask, the high-concentration impurity regions (pocket regions) being formed by the ion implantation can be formed at predetermined positions that are away from the channel region.

Since the gate electrode can be formed by one patterning step, variation in the gate length caused by applying the isotropic etching can be prevented and thus the transistor characteristics can be stabilized. Also, since the bottom surface and the top surface of the gate electrode can be formed to have the substantially same width, the distance between the gate electrodes can be reduced rather than the notch-type gate electrode in the prior art.

In addition, since the depth of the notch portion under the insulating films in the lateral direction can be controlled easily by adjusting thicknesses of the first and second insulating films, variation in the notch structure can also be prevented. Also, if the insulating films on the notch portion are formed as the multi-layered structure made of different materials, the height and the depth of the notch portion can be controlled by adjusting the film thickness of the first insulating film. In the case that the first insulating film and the second insulating film made of different materials are to be formed over the notch on the side surfaces of the gate electrode like the visor, if the third insulating film made of the same material as the first insulating film is formed selectively on the side walls of the gate electrode and then the first insulating film and the second insulating film are formed sequentially, the thickness of the first insulating film on the side surfaces of the gate electrode can be increased substantially by the third insulating film, and thus it becomes easy to deepen the notch in the lateral direction.

Further, since the insulating film on the notch is formed by the double-layered structure, if the second insulating film is left on the sides of the gate electrode by applying the unisotropic etching in the almost vertical direction and then only the first insulating film is removed by the wet etching, the notch that has the uniform shape and size can be formed in the wafer (substrate) surface and in the region having the density difference. Thus, variation of the notch in the wafer surface can be prevented. As a result, variation in the forming position of the high-concentration impurity regions can be reduced by executing the oblique ion implantation while using the notch-containing structure as a mask, and thus the uniform transistor characteristics can be obtained without the influence of the pattern density on the wafer.

Besides, the notches are formed between the first and second insulating films on the side surfaces of the gate electrode and the upper surface of the semiconductor substrate by forming the first insulating film and the second insulating film on the surfaces of the gate electrode and the upper surface of the semiconductor substrate, then applying the unisotropic etching to the second insulating film to leave selectively on both sides of the gate electrode, then forming the extension regions serving as the source/drain by introducing the impurity into the semiconductor substrate via the first insulating film on the semiconductor substrate, and then applying the isotropic etching to the first insulating film. Therefore, when the resist for covering the region into which the impurity ion that is implanted to form the extension regions should not be introduced is to be removed, the surface of the semiconductor substrate is protected by the first insulating film. As a result, the digging and the rough surface of the semiconductor substrate due to the dry process and the chemical process to remove the resist can be prevented.

What is claimed is:

1. A semiconductor device manufacturing method comprising the steps:

forming a gate electrode on a semiconductor substrate of one conductivity type via a gate insulating film;

forming a first insulating film on an upper surface of the semiconductor substrate and an upper surface and side surface of the gate electrode;

forming a second insulating film, which is made of different material from the first insulating film, on the first insulating film;

etching the second insulating film to leave on sides of the gate electrode;

etching selectively the first insulating film by using the second insulating film as a mask to leave the first insulating film in a region between the gate electrode and the second insulating film and to form spaces between the upper surface of the semiconductor substrate and the first insulating film and the second insulating film;

forming first and second pocket regions of one conductivity type on both sides under the gate electrode by implanting one conductivity type ion into the upper surface of the semiconductor substrate in an oblique direction while using the first insulating film and the second insulating film, being left on the sides of the gate electrode, and the gate electrode as a first mask;

forming first and second impurity diffusion regions of opposite conductivity type, which are connected to the first and second pocket regions in the semiconductor substrate separately and serve as source/drain, by introducing an opposite conductivity type impurity into the semiconductor substrate while using the first insulating film and the second insulating film, being left on the sides of the gate electrode, and the gate electrode, as a second mask; and forming insulating sidewall spacers filling the spaces below the second insulating film, on side surfaces of the second insulating film.

2. A manufacturing method of a semiconductor device according to claim 1, wherein a thickness of the first insulating film is equal to or thicker than a thickness of the second insulating film.

3. A manufacturing method of a semiconductor device according to claim 1, wherein the first insulating film is formed of one of a silicon oxide film and a silicon nitride film, and the second insulating film is formed of other one.

4. A manufacturing method of a semiconductor device according to claim 1, further comprising the step of, before the formation of the spaces by etching the second insulating film:

forming first and second extension regions constituting a part of the source/drain by ion-implanting the opposite conductivity type impurity into the semiconductor substrate through the second insulating film on the upper surface of the semiconductor substrate while using the gate electrode and the first insulating film and the second insulating film, being left on the sides of the gate electrode, as a third mask.

5. A manufacturing method of a semiconductor device according to claim 1, wherein the spaces are formed by wet-etching the first insulating film using a chemical solution.

6. A manufacturing method of a semiconductor device according to claim 1, wherein a sectional shape of the gate electrode is formed as a quadrangle.

7. A manufacturing method of a semiconductor device according to claim 1, further comprising the steps of, after forming the gate electrode and before forming the first insulating film:
    forming a third insulating film, which is made of a same material as the first insulating film, on the upper surface of the semiconductor substrate; and
    applying an unisotropic etching to the third insulating film to leave selectively on the side surfaces of the gate electrode.

8. A manufacturing method of a semiconductor device according to claim 7, wherein heights of the spaces with respect to the upper surface of the semiconductor substrate correspond to a film thickness of the first insulating film, and
    depths of the spaces in a parallel direction with the upper surface of the semiconductor substrate correspond to a total sum of thicknesses of the first insulating film, the second insulating film, and the third insulating film on the side surfaces of the gate electrode.

9. A manufacturing method of a semiconductor device comprising the steps of:
    forming a first gate electrode on a one conductivity type region in a semiconductor substrate via a gate insulating film respectively;
    forming a second gate electrode on an opposite conductivity type region in the semiconductor substrate via a gate insulating film;
    forming a first insulating film on upper surfaces of the first gate electrode, the second gate electrode, and the semiconductor substrate respectively;
    forming a second insulating film, which is made of different material from the first insulating film, on the first insulating film;
    applying an unisotropic etching to the second insulating film to leave selectively on both sides of the first gate electrode and the second gate electrode respectively;
    covering the second gate electrode and the opposite conductivity type region with a first resist;
    forming first and second extension regions of opposite conductivity type serving as source/drain on both sides under the gate electrodes by implanting an opposite conductivity type impurity into the one conductivity type region via the first insulating film while using the first gate electrode and the first insulating film and the second insulating film, being left on the sides of the first gate electrode, as a mask;
    removing the first resist from an upper surface of the semiconductor substrate;
    etching selectively the first insulating film to leave the first insulating film on both side surfaces of the first gate electrode and the second gate electrode respectively and to form a first space and a second space between the upper surface of the semiconductor substrate and the first insulating film and the second insulating film on sides of the first gate electrode and the second gate electrode respectively;
    covering selectively the opposite conductivity type region and the second gate electrode with a second resist;
    forming first and second pocket regions of one conductivity type, which are connected to end portions of the first and second extension regions respectively, by implanting the one conductivity type impurity ion into the one conductivity type region via the first space in an oblique direction to the upper surface of the semiconductor substrate while using the first gate electrode and the first insulating film and the second insulating film, being left on both side surfaces of the first gate electrode, as a mask; and
    removing the second resist into which the one conductivity type impurity ion is implanted.

10. A manufacturing method of a semiconductor device according to claim 9 further comprising the steps of:
    forming insulating sidewall spacers, which cover the first insulating film and the second insulating film on the spaces, on both sides of the first gate electrode and the second gate electrode respectively;
    covering selectively the opposite conductivity regions and the second gate electrode with a third resist; and
    forming high-concentration impurity regions of opposite conductivity type constituting a part of the source/drain by introducing the opposite conductivity type impurity into the one conductivity type region while using the sidewall spacers and the first gate electrode as a mask.

11. A manufacturing method of a semiconductor device according to claim 9, wherein the first resist is removed by a dry ashing process and a chemical process.

12. A manufacturing method of a semiconductor device according to claim 9, wherein the second resist is removed by one of a dry ashing process and a chemical process.

13. A manufacturing method of a semiconductor device according to claim 11 further comprising the steps of:
    forming insulating sidewall spacers, which cover the first insulating film and the second insulating film on the spaces, on both sides of the first gate electrode and the second gate electrode respectively;
    covering selectively the opposite conductivity regions and the second gate electrode with a third resist; and
    forming high-concentration impurity regions of opposite conductivity type constituting a part of the source/drain by introducing the opposite conductivity type impurity into the one conductivity type region while using the sidewall spacers and the first gate electrode as a mask.

14. A manufacturing method of a semiconductor device according to claim 12 further comprising the steps of:
    forming insulating sidewall spacers, which cover the first insulating film and the second insulating film on the spaces, on both sides of the first gate electrode and the second gate electrode respectively;
    covering selectively the opposite conductivity regions and the second gate electrode with a third resist; and
    forming high-concentration impurity regions of opposite conductivity type constituting a part of the source/drain by introducing the opposite conductivity type impurity into the one conductivity type region while using the sidewall spacers and the first gate electrode as a mask.

* * * * *